US009523146B1

United States Patent
Lin et al.

(10) Patent No.: US 9,523,146 B1
(45) Date of Patent: Dec. 20, 2016

(54) TI—SI—C—N PISTON RING COATINGS

(71) Applicant: Southwest Research Institute, San Antonio, TX (US)

(72) Inventors: Jianliang Lin, Helotes, TX (US); Ronghua Wei, San Antonio, TX (US); Peter Mark Lee, Fair Oaks Ranch, TX (US); Daniel Christopher Bitsis, Jr., San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 14/742,561

(22) Filed: Jun. 17, 2015

(51) Int. Cl.
*C23C 16/34* (2006.01)
*C23C 14/06* (2006.01)
*C23C 14/35* (2006.01)
*C23C 14/34* (2006.01)
*F16J 9/26* (2006.01)
*F16J 9/28* (2006.01)

(52) U.S. Cl.
CPC ......... *C23C 14/0664* (2013.01); *C23C 14/345* (2013.01); *C23C 14/35* (2013.01); *F16J 9/26* (2013.01); *F16J 9/28* (2013.01)

(58) Field of Classification Search
CPC ........... F16J 9/26; C23C 14/0641; C23C 8/80; C23C 16/34; B23P 15/08; G03C 1/74; B82Y 30/00; B05D 1/34
See application file for complete search history.

(56) References Cited

U.S. PATENT DOCUMENTS

| | | |
|---|---|---|
| 2,956,848 A * | 10/1960 | St Clair .................. F16J 9/26 264/259 |
| 4,321,311 A | 3/1982 | Strangman |
| 4,419,416 A | 12/1983 | Gupta et al. |
| 4,585,481 A | 4/1986 | Gupta et al. |
| 4,588,490 A | 5/1986 | Cuomo et al. |
| 5,122,252 A | 6/1992 | Latz et al. |
| 5,178,739 A | 1/1993 | Barnes et al. |
| 5,308,806 A | 5/1994 | Maloney et al. |
| 5,309,874 A | 5/1994 | Willermet et al. |
| 5,346,600 A | 9/1994 | Nieh et al. |

(Continued)

FOREIGN PATENT DOCUMENTS

JP 2000326108 11/2000

OTHER PUBLICATIONS

Anton et al., Thermal Cycling Testing of Thermal Barrier Coatings, Cyclic Oxidation of High Temperature Materials, Chapter 21, 1999, pp. 339-356.

(Continued)

*Primary Examiner* — Eugene G Byrd
(74) *Attorney, Agent, or Firm* — Grossman, Tucker et al.

(57) ABSTRACT

A Ti—Si—C—N coating for a piston ring and a method forming such coating, wherein the deposited coating exhibits a thickness in the range of 10.0 micrometers to 20.0 micrometers and exhibits a coefficient of friction of less than 0.15 and a wear rate of less than $10 \times 10^{-6}$ mm$^3$/N/m. The coefficient of friction being measured on a Plint TE77 and the wear rate being measured against an alumina ball of 0.25 inches in diameter at a load of 1 N at 100 rpm in a dry environment. The deposited Ti—Si—C—N coating includes nanocrystalline phases in an amorphous matrix.

15 Claims, 26 Drawing Sheets

(56) References Cited

U.S. PATENT DOCUMENTS

| | | | |
|---|---|---|---|
| 5,499,905 | A | 3/1996 | Schmitz et al. |
| 5,683,825 | A | 11/1997 | Bruce et al. |
| 5,824,198 | A | 10/1998 | Williams et al. |
| 5,858,471 | A | 1/1999 | Ray et al. |
| 5,948,215 | A | 9/1999 | Lantsman |
| 6,054,188 | A | 4/2000 | Tropsha et al. |
| 6,087,025 | A | 7/2000 | Dearnaley et al. |
| 6,171,454 | B1 | 1/2001 | Weber et al. |
| 6,255,007 | B1 | 7/2001 | dos Santos Pereira Ribeiro |
| 6,444,036 | B2 | 9/2002 | Chern et al. |
| 6,455,167 | B1 | 9/2002 | Rigney et al. |
| 6,500,742 | B1 | 12/2002 | Chern et al. |
| 6,504,151 | B1 | 1/2003 | Mitchell et al. |
| 6,548,161 | B1 | 4/2003 | Torigoe et al. |
| 6,585,870 | B1 | 7/2003 | Pitcher et al. |
| 6,599,399 | B2 | 7/2003 | Xu et al. |
| 6,699,530 | B2 | 3/2004 | Danek et al. |
| 6,767,436 | B2 | 7/2004 | Wei |
| 6,869,676 | B2 | 3/2005 | Burger et al. |
| 6,896,773 | B2 | 5/2005 | Chistyakov |
| 6,896,775 | B2 | 5/2005 | Chistyakov |
| 6,923,885 | B2 | 8/2005 | Masuda et al. |
| 7,067,002 | B2 | 6/2006 | Schmidt et al. |
| 7,258,912 | B2 | 8/2007 | Yamamoto et al. |
| 7,361,386 | B2 | 4/2008 | Kim et al. |
| 8,029,875 | B2 | 10/2011 | Wei et al. |
| 8,034,459 | B2 | 10/2011 | Wei et al. |
| 8,252,388 | B2 | 8/2012 | Wei et al. |
| 8,496,992 | B2 | 7/2013 | Wei et al. |
| 8,790,791 | B2 | 7/2014 | Cheruvu et al. |
| 2001/0025205 | A1 | 9/2001 | Chern et al. |
| 2002/0001976 | A1 | 1/2002 | Danek et al. |
| 2002/0032073 | A1 | 3/2002 | Rogers et al. |
| 2002/0132132 | A1 | 9/2002 | Bose et al. |
| 2002/0197502 | A1 | 12/2002 | Zhao et al. |
| 2003/0211736 | A1 | 11/2003 | Ludviksson et al. |
| 2004/0055870 | A1 | 3/2004 | Wei |
| 2004/0099215 | A1 | 5/2004 | Danek et al. |
| 2004/0144318 | A1 | 7/2004 | Beck et al. |
| 2004/0244653 | A1 | 12/2004 | Schmidt et al. |
| 2004/0259366 | A1 | 12/2004 | Kim et al. |
| 2005/0011748 | A1 | 1/2005 | Beck et al. |
| 2005/0079368 | A1 | 4/2005 | Gorman et al. |
| 2005/0170162 | A1 | 8/2005 | Yamamoto et al. |
| 2006/0026995 | A1 | 2/2006 | Wang |
| 2006/0147728 | A1 | 7/2006 | Shen et al. |
| 2006/0166019 | A1 | 7/2006 | Spitsberg et al. |
| 2007/0087185 | A1 | 4/2007 | Wei et al. |
| 2007/0187812 | A1* | 8/2007 | Izumi ............... B08B 7/00 257/700 |
| 2007/0284255 | A1 | 12/2007 | Gorokhovsky et al. |
| 2009/0214787 | A1* | 8/2009 | Wei ............... C23C 8/02 427/255.394 |
| 2010/0068556 | A1 | 3/2010 | Lemmon et al. |
| 2010/0098964 | A1* | 4/2010 | Ruebig ............... C23C 8/10 428/547 |
| 2010/0104859 | A1 | 4/2010 | Berczik et al. |
| 2010/0326321 | A1* | 12/2010 | Enomura ............ B01F 7/00758 106/31.6 |
| 2011/0256417 | A1 | 10/2011 | Cheruvu et al. |
| 2013/0241154 | A1* | 9/2013 | Shim ............... F16J 9/26 277/442 |
| 2016/0153559 | A1* | 6/2016 | Duggal ............... C08G 18/7671 528/65 |

OTHER PUBLICATIONS

ASTM International, "Standard Test Method for Conducting Erosion Tests by Solid Particle Impingement Using Gas Jets," Designation G76-07 (6 pgs).

Chan et al., Degradation Mechanism Characterization and Remaining Life Prediction for NiCoCrAlY Coatings, Proceedings of ASME Turbo Expo 2004, Power for Land, Sea, and Air, Jun. 14-17, 2004, pp. 1-8, Vienna, Austria.

Chen et al., Oxidation behavior of sputtered Ni-3Cr-20Al nanocrystalline coating, Materials Science and Engineering, 1999, pp. 360-365.

Chen et al., The Mechanism of Oxidation of Sputtered Ni—Cr—Al Nanocrystalline Coatings, Corrosion Reviews, 2000, pp. 195-204, vol. 18, Nos. 2-3.

Cheruvu et al., Cyclic Oxidation Behavior and Microstructure of Nanocrystalline Ni-20Cr-4Al Coating, Oxid Met, 2010, pp. 493-511, 73.

Cheruvu et al., Effect of Time and Temperature on Thermal Barrier Coating Failure Mode Under Oxidizing Environment, Journal of Engineering for Gas Turbines and Power, Mar. 2009, 7 pages, vol. 131.

Cheruvu et al., Evaluation, degradation and life assessment of coatings for land based combustion turbines, Energy Materials, 2006, pp. 33-47, vol. 1.

Cheruvu et al., In-service Degradation and Life Prediction of Coatings for Advanced Land-based Gas Turbine Buckets*, JSME International Journal, 2003, pp. 635-641, Series A, vol. 46, No. 4.

Ding et al., Mechanical properties and wear resistance of multilayer thin coatings on cutting tools, Journal of Tribology, vol. 20, No. 3, pp. 170-174 Jun. 30, 2000.

Diserens, et al "Improving the Properties of Titanium Nitride by Incorporation of Silicon"; Surface and Coatings Technology, Elsevier, Amsterdam, N, vol. 108-109; No. 1-3, Apr. 27, 1998, pp. 241-246.

Gao et al., Nano- and Microcrystal Coatings and Their High-Temperature Applications**, Advanced Materials, Jul. 1, 2001, pp. 1001-1004, vol. 13, No. 12-13.

Geng et al., Hot-Corrosion Resistance of a Sputtered K38G Nanocrystalline Coating in Molten Sulfate at 900° C., Oxidation of Metals, Jun. 2002, pp. 549-557, vol. 57, Nos. 5/6.

Harvey, What is an MCrAlY coating?, http://www.twi.co.uk/content/faqmdfh005.html, downloaded from internet Mar. 24, 2010, 2 pages.

Hass, Thermal Barrier Coatings, Chapter 2, Directed Vapor Deposition of Thermal Barrier Coatings, 2000, Ph.D. Dissertation, University of Virginia, pp. 6-20.

ubaker.com, "Hexamethyldisilozane," available at www.jbaker.com/msds/englishhtml/h2066.htm; retrieved on Feb. 5, 2009, 5 pages.

Krzanowski, et al; "Mechanical Properties of Sputter-Deposited Titanium-Silicon-Carbon Films"; Journal of the American Ceramic Society, Mar. 2001, vol. 84, No. 3, pp. 672-674.

Liu et al., Cyclic Oxidation of Sputter-Deposited Nanocrystalline Fe—Cr—Ni—Al Alloy Coatings, Oxidation of Metals, 1999, pp. 403-419, vol. 51, Nos. 5/6.

Liu et al., Improved Oxide Spallation Resistance of Microcrystalline Ni—Cr—Al Coatings, Oxidation of Metals, 1998, pp. 51-69, vol. 50, Nos. 1/2.

Liu et al., Oxidation behaviour of nanocrystalline Fe—Ni—Cr—Al alloy coatings, Material Science and Technology, Dec. 1999, pp. 1447-1450, vol. 15.

Liu et al., Oxidation Behaviour of Sputter-Deposited Ni—Cr—Al Micro-Crystalline Coatings, Elsevier Science Ltd., 1998, pp. 1691-1700, vol. 46, No. 5.

Liu et al., The Effect of Coating Grain Size on the Selective Oxidation Behaviour of Ni—Cr—Al Alloy, Elsevier Science Ltd, 1997, pp. 1551-1558, vol. 37, No. 10.

Merceron et al., Long Term Oxidation of FeCrAl ODS Alloys at High Temperature, Materials Science Forum, 2001, pp. 269-276, vols. 369-372.

Miller, Current Status of Thermal Barrier Coatings—An Overview*, Surface and Coatings Technology, 1987, pp. 1-11, 30.

Movchan et al., Two- and three-layer coatings produced by deposition in vacuum for gas turbine blade protection, Surface and Coatings Technology, 1994, pp. 55-63, 67.

Niederhoferet et al. Surface and Coating Technology, 120-121, 1999, 173-178.

(56) References Cited

OTHER PUBLICATIONS

Oliver, et al., "An improved technique for determining hardness and elastic modulus using load and displacement sensing indentation experiments," J. Mater. Res., vol. 7, No. 6, Jun. 1992, pp. 1564-1583.
Padture et al., Thermal Barrier Coatings for Gas-Turbine Engine Applications, Science—Science's Compass—Review, Apr. 12, 2002, pp. 280-284, vol. 296.
Poire, "Micro Photonics Inc.," Analytical Report NHT-020802, Method: Nano Hardness Tester. Sample(s) Optical Fiber w/connector. Customer: Megladon Manufacturing Gp., Date: Aug. 2, 2002. 8 pages.
Science Lab.com, "Material Safety Data Sheet, Hexamethyldisiloxane MSDS," available at http://www.sciencelab.com/xMSDS-Hexamethyldisiloxane-9924249, retrieved on May 1, 2009. 6 pages.
Seal, "Transition Metal Nitride Functional Coatings," JOM; Functional Coatings Overview. Dated: Sep. 2001. 1 page.
Stiger et al., Mechanisms for the Failure of Electron Beam Physical Vapor Deposited Thermal Barrier Coatings Induced by High Temperature Oxidation, Elevated Temperature Coatings: Science and Technology III,The Minerals, Metals & Materials Society, 1999, pp. 51-65.
Swann, "Magnetron Sputtering," Phys. Technol. 19. Dated 1988. 9 pages. IOP Publishing Ltd. Printed in the UK.
Swminathan, et al "Erosion Resistant Nano Technology Coatings for Gas Turbine Components" ASME Turbo Expo 2007, May 14-17, 2007, Montreal Canada, Paper #GT2007-27027.
Uusitalo et al., High temperature corrosion of coatings and boiler steels in reducing chlorine-containing atmosphere, Surface and Coatings Technology, 2002, pp. 275-285, 161.
Vacuum Turbine Blade Coating—Electron Beam / Physical Vapor Deposition (EB/PVD) of Protective MCrAlY) and Thermal Barrier Coatings (TBC) The Solution ALD, http://web.ald-vt.de/cms/vakuum-technologie/anlagen/edpve/, downloaded from interned Mar. 24, 2010, 3 pages.
Verein Deutscher Ingenieure Normen, VDI 3198, VDI-Verlag, Dusseldorf, 1991 (non-English).
Wang, The Effect of Nanocrystallization on the Selective Oxidation and Adhesion of Al2O3 Scales, Oxidation of Metals, 1997, pp. 215-224, vol. 48, Nos. 3/4.
Wang et al., The Mechanism of Scale Adhesion on Sputtered Microcrystallized CoCrAl Films, Oxidation of Metals, 1996, pp. 39-50, vol. 45, Nos. 1/2.
Wei et al., Deposition of thick nitrides and carbonitrides for sand erosion protection, Surface & Coatings Technology, 2006, pp. 4453-4459, 201.
Wei et al, "Erosion Resistance of Thick Nitrides and Carbonitrides Deposited using Plasma Enhanced Magnetron Sputtering," Plasma Processes and Polymers, 4 (2007) 693-699.
Wei, Plasma Enhanced Magnetron Sputter (PEMS) Deposition of Thick Nanocomposite Coatings for Erosion Protection, Chapter 6, Nanocomposite Coatings and Nanocomposite Materials, pp. 239-269.
Wei, Plasma enhanced magnetron sputter deposition of Ti—Si—C—N based nanocomposite coatings, Surface & Coatings Technology, 2008, pp. 538-544, 203.
Wei, Plasma enhanced magnetron sputtering deposition of superhard, nanocomposite coatings, Plasma Surface Engineering Research and its Practical Applications, 2008, pp. 87-111.
Wei, Solid Particle Erosion Protection of Turbine Blades with Thick Nitride and Carbonitride Coatings from Magnetron Sputter Deposition, Proceedings of the 5th International Surface Engineering Congress, May 15-17, 2006, pp. 78-84.
Wright et al., Influence of Aluminum Depletion Effects on the Calculation of the Oxidation Lifetimes of FeCrAl Alloys, Materials Science Forum, 2004, pp. 579-590, vols. 461-464.
Xiao et al, "Plasma-enhanced Deposition of Hard Silicon Nitride-like Coatings From Hexamethyldisiloxane and Ammonia"; Elsevier Science B.V., Surface and Coatings Technology 172, 2003 (pp. 184-188).
Xu et a; "Tribological Behavior of a TiSiCN Coating Tested in Air and Coolant," Surf. Coat. Technol. 201 (2006) 4236-4241.
Zhang et al., Hot Corrosion of an Electrodeposited Ni-11 wt % Cr Nanocomposite under Molten Na2SO4—K2SO4—NaCl, Journal of the Electrochemical Society, 2005, pp. B321-B326.
International Search Report and Written Opinion issued in related International Patent Application No. PCT/US06/60053 dated Sep. 25, 2007.
Chinese Office Action dated Jan. 29, 2010 issued in Chinese Patent Application No. 200680035958.8.
Chinese Office Action dated Sep. 2, 2010 issued in Chinese Patent Application No. 200680035958.8.
Chinese Office Action dated Dec. 27, 2010 issued in Chinese Patent Application No. 200680035958.8.
Chinese Office Action issued Dec. 31, 2011 in Chinese Application No. 200680035958.8.
European Search Report and Written Opinion of the Search Authority dated Nov. 12, 2012, issued in European Application No. 06839460.0.
U.S. Office Action dated Oct. 14, 2010 issued in U.S. Appl. No. 11/550,718.
US Office Action issued Mar. 31, 2011 in U.S. Appl. No. 11/550,718.
US Office Action issued Aug. 29, 2011 in U.S. Appl. No. 12/391,416.
US Office Action issued Jan. 25, 2012 in U.S. Appl. No. 12/391,416.
US Office Action issued Jan. 3, 2013 in U.S. Appl. No. 12/391,416.
US Office Action issued Jul. 30, 2013 in U.S. Appl. No. 12/391,416.
US Office Action issued Jan. 4, 2012 in U.S. Appl. No. 12/760,864.
US Office Action issued Sep. 11, 2012 in U.S. Appl. No. 12/760,864.
US Office Action issued Sep. 6, 2013 in U.S. Appl. No. 12/760,864.

\* cited by examiner

TI—SI—C—N PISTON RING COATINGS

FIELD OF INVENTION

The present disclosure is directed to piston ring coatings and to the preparation of piston ring coatings of Ti—Si—C—N using plasma enhanced magnetron sputtering techniques.

BACKGROUND

Automobile manufacturers and component makers have been engineering automotive components to achieve the gradually increasing Corporate Average Fuel Economy (CAFE) standards, which target an average fleet fuel consumption of 34.1 MPG by 2016 and 56.2 MPG by 2025. One design initiative to achieve CAFE standards is the reduction in the coefficient of friction of moving parts. In addition to achieving CAFE standards, a reduction in the coefficient of friction may also reduce wear and improve reliability of moving components.

One such moving part is the piston ring. One or more piston rings are commonly provided in grooved tracks around the outer perimeter of an engine piston. Where multiple rings are present, the rings may be designed to perform different or overlapping functions. For example, piston rings may be designed to seal the combustion chamber to trap combustion gasses, improving engine efficiency. Piston rings may also be designed to aid in heat transfer and manage engine oil in the cylinder.

Piston rings are often formed from a base material of cast iron or rolled carbon steel and may be coated with relatively hard, wear resistant coatings, such as nitride coatings, exhibiting hardness 2 to 4 times that of the base materials. Chromium nitride coatings may exhibit relatively low internal stress allowing for relatively thick coating layers. Chromium nitride coating deposition rates are considered somewhat favorable for production at deposition rates of approximately 2 microns per hour. Titanium nitride coatings have also been examined. However, titanium nitride coatings may exhibit relatively high internal stress compared to chromium nitride coatings.

The coefficient of friction for chromium nitride and titanium nitride coatings may be in the range of 0.5 to 0.7 in dry sliding as measured by typical pin-on-disc testing. Reducing the coefficient of friction values between a piston and cylinder liner wall may reduce overall engine friction and improve fuel efficiency. However, maintaining relatively high deposition rates, relatively high hardness and relatively high wear resistance is also desirable. Accordingly, a need for providing a relatively hard, wear resistant, and cost effective piston ring coating exhibiting a relatively lower coefficient of friction still remains.

SUMMARY

An aspect of the present disclosure relates to a method of coating piston rings. The piston ring may be placed into a process chamber and gas pressure in the process chamber may be reduced. Inert gas may then be supplied to the process chamber and plasma may be generated from the inert gas. The coatings may then be formed by supplying nitrogen gas into the process chamber at a flow rate of 40 sccm to 60 sccm, supplying hexamethyldisilazane at a rate of 3 grams per hour to 9 grams per hour, supplying acetylene at a rate of 10 standard cubic centimeters per minute (sccm) to 50 sccm, and sputtering titanium from a magnetron target. A Ti—Si—C—N coating is deposited on the piston ring having a thickness in the range of 10.0 micrometers to 40.0 micrometers and exhibits a coefficient of friction of less than 0.15, a wear rate of less than $10 \times 10^{-6}$ mm$^3$/N/m, and a nanohardness in the range of 10.0 GPa to 30.0 GPa. The coefficient of friction is measured using the Plint TE77 testing apparatus using a 10W-30 oil maintained at 35° C. as a lubricant, a normal force of 30 N, and a sliding frequency of 5 to 20 Hz. The wear rate is measured against an alumina ball of 0.25 inches in diameter at a load of 1 N at 100 rpm in a dry environment, i.e., without lubricant. In addition, the Ti—Si—C—N coating includes nanocrystalline phases in an amorphous matrix, wherein the nanocrystalline phases include TiC$_x$N$_y$, wherein x is in the range of 0.0 to 1.0 and y is in the range of 1.0 to 0.0.

A further aspect of the present disclosure relates to a coated piston ring. The coated piston ring may include a split ring formed of an iron based alloy. A Ti—Si—C—N coating deposited on the surface of the piston ring may have a thickness in the range of 10.0 micrometers to 40.0 micrometers that exhibits a coefficient of friction of less than 0.4, a wear rate of less than $10 \times 10^{-6}$ mm$^3$/N/m, and a nanohardness in the range of 10.0 GPa to 30.0 GPa. The coefficient of friction is measured using the Plint TE77 testing apparatus using a 10W-30 oil maintained at 35° C. as a lubricant, a normal force of 30 N, and a sliding frequency of 5 to 20 Hz. The wear rate is measured against an alumina ball of 0.25 inches in diameter at a load of 1 N at 100 rpm in a dry environment. The Ti—Si—C—N coating includes nanocrystalline phases in an amorphous matrix, wherein the nanocrystalline phases include TiC$_x$N$_y$, wherein x is in the range of 0.0 to 1.0 and y is in the range of 1.0 to 0.0.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
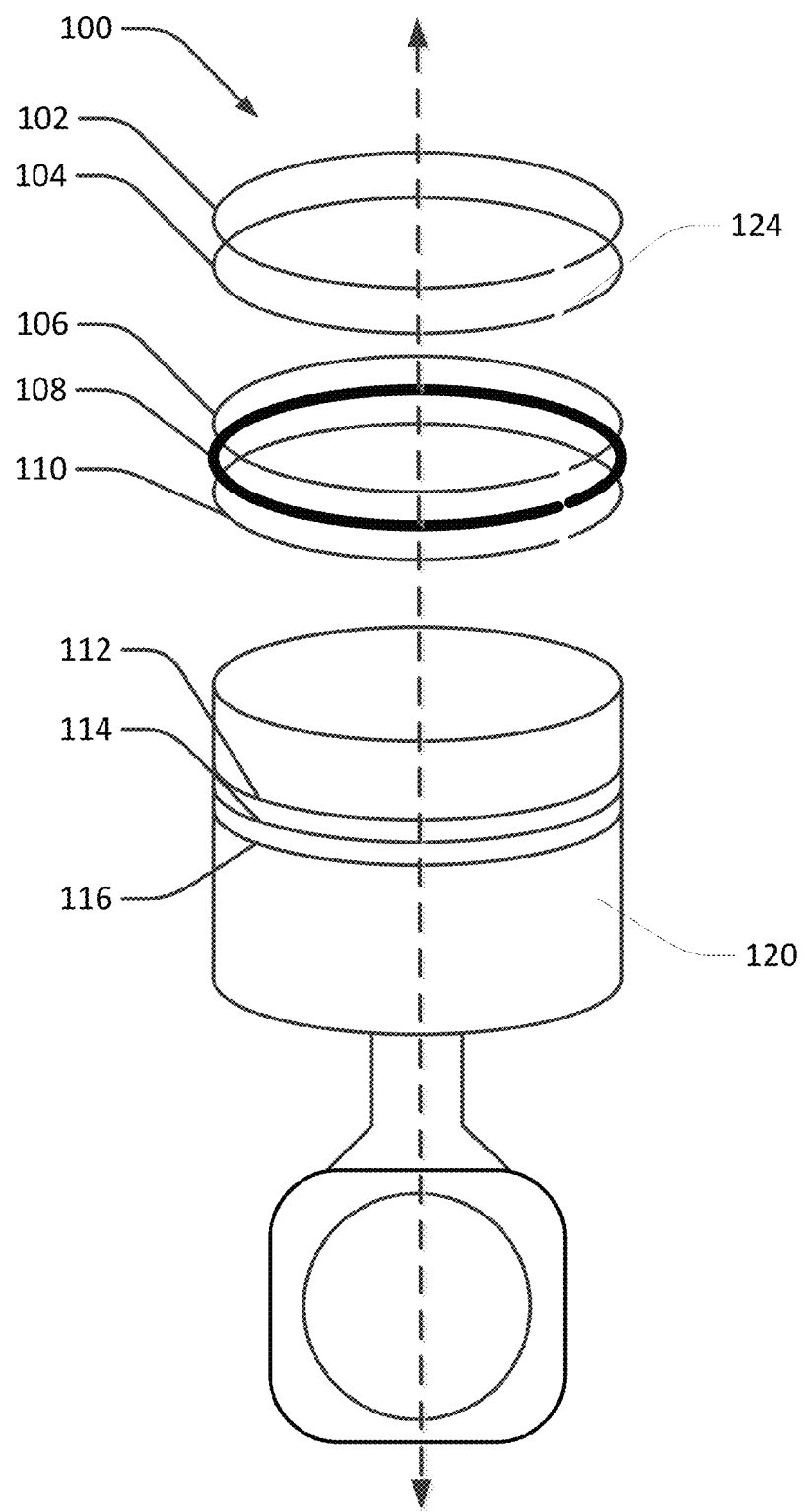
FIG. 1 illustrates a perspective exploded view of a piston and piston rings.

Piston rings are commonly used to provide a seal between a piston and the cylinder liner so that the engine combustion chamber can achieve a desired pressure. As illustrated in FIG. 1, one or more piston rings 102, 104, 106, 108, 110 may be provided around the outer perimeter of an engine piston 100 and are often held in grooved tracks 112, 114, 116 formed in the surface 120 of the piston 100. Where multiple rings are present, the rings may be designed to perform different or overlapping functions. For example, compression rings 102, 104 may be designed to seal the combustion chamber to trap combustion gasses and oil control rings may be designed to manage engine oil in the cylinder. Spacer rings 108 may be provided between two rings 106, 110 to keep the rings spaced apart and is common in oil control ring arrangements. Due to the sliding action of the piston and piston ring against the cylinder liner wall, reducing the coefficient of friction between the piston ring and wall may help improve the efficiency of the engine. In combination with exhibiting a relatively low coefficient of friction, it is also desirable for piston rings to exhibit high hardness and low wear rates so as to maintain their integrity over the life cycle of the engine.

The present disclosure is directed to Ti—Si—C—N coated piston rings and methods of forming such rings. Referring again to FIG. 1, the piston rings 102, 104, 106, 108, 110 may be split rings with a split 124 that allows the rings to open and expand for placement over the piston. While the split is illustrated as being a vertical split, the split may assume a number of configurations. The piston rings may be formed from an iron based alloy, wherein the alloy includes at least 50 atomic percent of iron. Examples include cast iron, steel, or stainless steel. In addition, the rings may exhibit a variety of cross-sectional configurations including barrel face, keystone, torsional, reverse torsional, wiper, or keystone torsional configurations.

The piston rings are coated with Ti—Si—C—N coatings. The Ti—Si—C—N coatings may comprise, consist essentially of, or consist of titanium present in the range of 35 to 49 atomic percent, including all values and ranges therein, silicon present in the range of 1 to 5 atomic percent, including all values and ranges therein, carbon present in the range of 17 to 41 atomic percent, including all values and ranges therein, and nitrogen present in the range of 19 to 35 atomic percent, including all values and ranges therein. In embodiments, the coatings include a composition of 43.5 to 46.7 atomic percent titanium, 1.58 to 3.04 atomic percent silicon, 30.9 to 34.2 atomic percent nitrogen, and 17.6 to 22.5 atomic percent carbon.

In preferred embodiments, the coatings preferably include a composition of 38 to 48.4 atomic percent titanium, 1.84 to 2.34 atomic percent silicon, 21.59 to 28.09 atomic percent nitrogen, and 21.5 to 38.1 atomic percent carbon. In further preferred embodiments, the coatings preferably include a composition of 35.6 to 43.3 atomic percent titanium, 2.33 to 4.12 atomic percent silicon, 19.64 to 25.34 atomic percent nitrogen, and 29.0 to 40.8 atomic percent carbon. In more preferred embodiments, the coatings preferably include titanium present in the range of 41 to 43.3 atomic percent, silicon present in the range of 2.3 to 3.8 atomic percent, carbon present in the range of 29 to 33 atomic percent, and nitrogen present in the range of 22 to 25 atomic percent.

As noted, the coatings may comprise or consist essentially of the elements of titanium, silicon, carbon and nitrogen at or within the ranges noted above or consist of the elements of titanium, silicon, carbon and nitrogen at or within the ranges noted above, with the understanding that some amount of impurities may be present depending on the level of impurities present in the feed stocks or introduced by the deposition process. For example, the feed stocks or gasses may be supplied containing impurities. Such impurities may be present in the range of 0.001 to 1.0 atomic percent, including all values and ranges therein.

The deposited Ti—Si—C—N coatings may exhibit nanocrystalline phases in an amorphous matrix. The nanocrystalline phases may include $TiC_xN_y$ phases. In such phases x is in the range of 0.00 to 1.00, including all values and ranges therein, such as 0.00, 0.01 to 1.00, 0.01 to 0.10, 0.10 to 1.00, etc. and y is in the range of 1.00 to 0.00, including all values and ranges therein, such as 0.00, 1.00 to 0.01, 1.00 to 0.10, 0.10 to 0.01, etc. In embodiments, $TiC_xN_y$ phases may include TiN, $TiC_{0.3}N_{0.7}$, $TiC_{0.7}N_{0.3}$, $Ti_4N_3$, and combinations thereof. In particular embodiments, y is equal to 1-x, wherein $TiC_xN_{(1-x)}$, and phases include TiN, $TiC_{0.3}N_{0.7}$, $TiC_{0.7}N_{0.3}$, etc. The nanocrystalline phases may exhibit a grain size in the range of 3 nm to 10 nm, including all values and ranges therein, such as 4.5 nm to 7 nm.

The amorphous matrix includes a composition selected from diamond like carbon (DLC), Si—N and Si—C—N, with the understanding that impurities may be present from 0.001 to 1 atomic percent in the amorphous phase, including all values and ranges therein. Again, impurities may be introduced in the feedstocks or in the deposition process. In particular embodiments, the amorphous matrix may include diamond like carbon including varying ratios of $sp^2$ bonded and $sp^3$ bonded phases, including all $sp^2$ phases or all $sp^3$ phases.

The coatings may be formed at a thickness of 10 to 40 micrometers, including all values and ranges therein, such as 10 to 20 micrometers. The coatings provide a coefficient of friction of less than 0.15, including all values and ranges therein, such as in the range of 0.05 to 0.15, 0.05 to 0.10, etc., as measured on a Plint TE77 testing apparatus using a 10W-30 oil maintained at 35° C., a normal force of 30 N, and a sliding frequency of 5 to 20 Hz. The coatings may also provide a coefficient of friction in the range of less than 0.4, including all values and ranges therein such as in the range of 0.16 to 0.4, 0.16 to 0.33, 0.21 to 0.33, 0.16 to 0.21, 0.21 to 0.22, as determined via a pin-on-disc tribometer using an alumina ball of 0.25 inches in diameter at a load of 1 N at 100 rpm in a dry environment.

The coatings may further provide a nanohardness hardness of 10.0 GPa to 30.0 GPa, including all values and ranges therein, such as in the range of 10 GPa to 20 GPa, 14.5 GPa to 16.7 GPa, 13.8 GPa to 14.5 GPa, 14.5 GPa, etc., as measured by a nanoindenter (NanoIndenter XP™, MTS Systems Corporation) equipped with a diamond Berkovich indenter by taking 12 effective measurements. In addition, the coatings may provide a wear rate of less than $10 \times 10^{-6}$ $mm^3/N/m$, including all values and ranges therein, such as from $3.02 \times 10^{-6}$ $mm^3/N/m$ to $7.35 \times 10^{-6}$ $mm^3/N/m$, $4.59 \times 10^{-6}$ to $5.025 \times 10^{-6}$ $mm^3/N/m$, $3.84 \times 10^{-6}$ to $5.78 \times 10^{-6}$ $mm^3/N/m$, $4.69 \times 10^{-6}$ $mm^3/N/m$ to $5.78 \times 10^{-6}$ $mm^3/N/m$, wherein the wear rate is determined via a pin-on-disc tribometer using an alumina ball of 0.25 inches in diameter at a load of 1 N at 100 rpm in a dry environment. The ability of the coatings, and coated piston rings, to exhibit all three of these characteristics at thicknesses of 40 micrometers or less, and particularly at a thickness of 20 microns or less, is contemplated to provide not only improved engine performance in terms of efficiency but also an increase in engine life span over coatings that exhibit a relatively higher coefficient of friction.

The Ti—Si—C—N coatings may be deposited using physical vapor deposition. In particular, plasma enhanced magnetron sputtering of titanium in the presence of nitrogen, hexamethyldisilizane, and, optionally, a carbon containing gas. Generally, plasma enhanced magnetron sputtering may utilize a gas plasma in the chamber to assist in the coating process, forming denser coatings. In the present process, to introduce silicon, carbon and nitrogen into the coatings, nitrogen gas and hexamethyldisilizane may be supplied to the process chamber during the sputtering process. Acetylene may also be supplied to the process chamber during the sputtering process to increase the carbon content of the coatings. In addition to, or alternatively, nitrogen may be introduced into the process by providing ammonia to the chamber and carbon may be introduced into the process by providing methane to the chamber.

Figure 2:
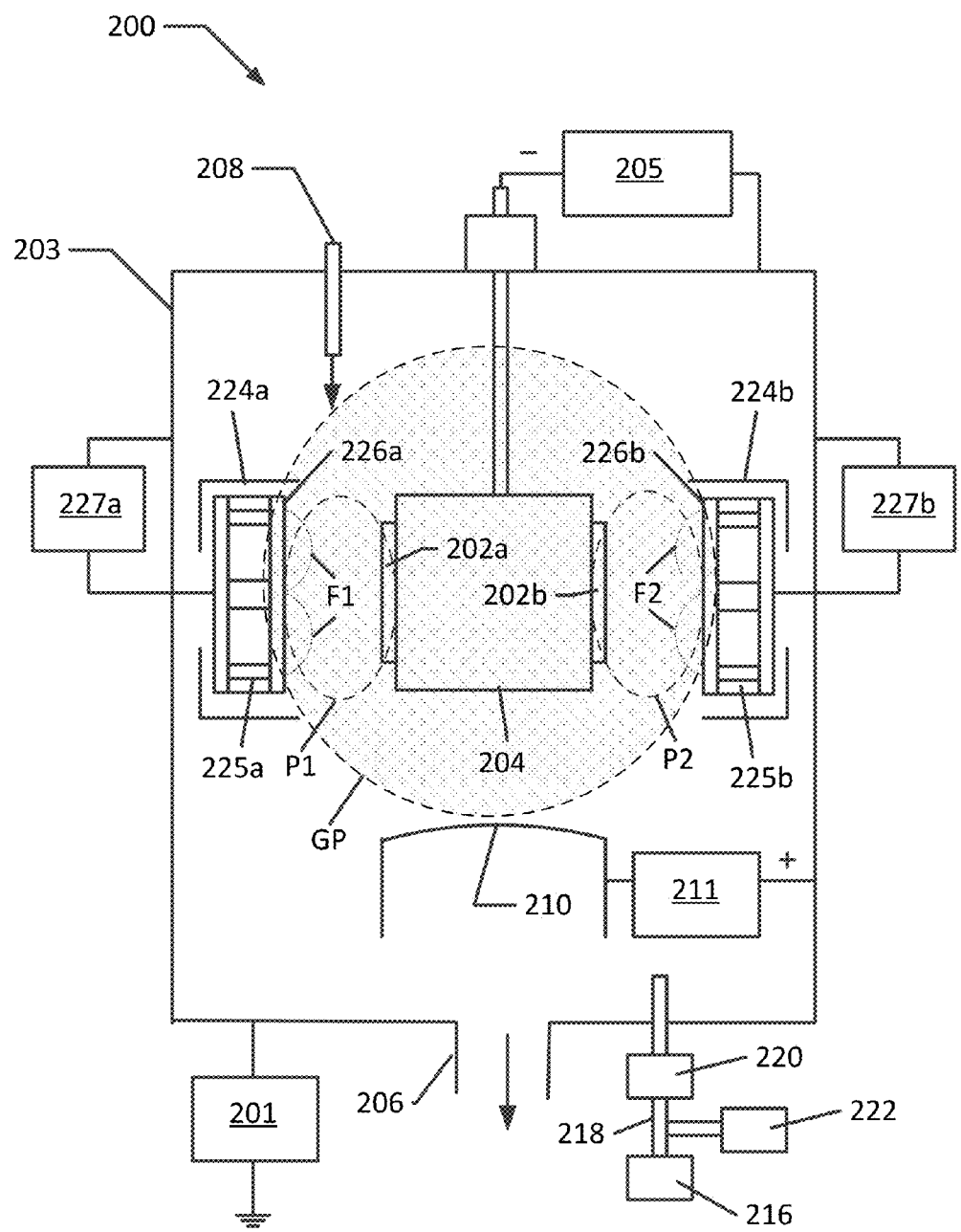
FIG. 2 illustrates a schematic of a process chamber.

With reference to FIG. 2, a process chamber 200 may be provided including a substrate holder 204 on which substrates (i.e., piston rings) 202a, 202b (referred to herein as substrate 202) may be mounted. While the process chamber may be grounded, a power supply 201 may be provided to positively bias the process chamber wall 203 relative to other components associated with the process chamber, such as an electron source, work table, substrate or magnetron. Another power supply 205 may be provided to negatively bias the substrate holder 204, the substrate 202 or both. The power supplies 201, 205 may individually be selected as an AC, DC or RF power supply.

A vacuum system 206 may also be provided to reduce the pressure within the process chamber. The vacuum system 206 may include an outlet in the process chamber 200 that is in fluid communication through a flow path with one or more vacuum pumps. In addition, one or more valves may be provided in the vacuum system 206 to regulate the flow of gasses in the chamber.

The process chamber may further include one or more gas supply ports 208. One or more gasses may be provided through each gas supply port 208. Gasses provided through the gas supply ports may include argon or other inert gasses such as krypton or xenon. Further process gasses that may form a portion of the coating, such as nitrogen or acetylene, may also be provided through the gas supply port.

An electron source 210 may also be provided in the process chamber 200. The electron source 210 may include, for example, a hollow cathode, an RF antenna, a microwave generator, a thermionic filament or a combination thereof. As illustrated, the electron source 210 is a single thermionic filament, which may be formed from tungsten or tantalum. The filament may discharge electrons into the system when heated to the thermionic emission temperature of the material forming the filament. An energy source 211, i.e., power supply, may be used to apply a bias to the electron source 210 and may include an AC, DC or RF power supply.

A precursor system may be provided to supply hexamethyldisilizane to the process chamber 200. The precursor system may include a vessel 216 for storage of the hexamethyldisilizane as a liquid and one or more tubes or pipes to provide a flow path 218 between the vessel 216 to the process chamber 200. A mass flow controller 220 may be provided in communication with the flow path to regulate the amount of hexamethyldisilizane entering the process chamber. The vessel 216, flow path 218, and mass flow controller 220 may be heated at a temperature in the range of about 30° C. to 50° C. using, for example, heater bands, hot air, hot water or hot oil. A liquid flow controller may be used instead of heating the vessel 216. Heating the precursor system, or at least a portion thereof, may volatilize the hexamethyldisilizane so that it may be introduced to the process chamber 200 in vapor form. The precursor system may also include a purging system 222 for clearing gasses out of the flow path 218 to prevent contamination of the hexamethyldisilizane entering the process chamber 200. The purging system may reduce the pressure in the flow path 218 to reduce, or substantially reduce, the presence of gasses in the flow path 218.

The metal (titanium) may be provided by a magnetron. As illustrated, there are two magnetrons 224a, 224b (referred to herein as 224) provided in the process chamber. The magnetrons 224 may each include a target 226a, 226b (herein after 226), which provides the metal source for the coatings. The magnetrons may also each include magnets 225a, 225b (hereinafter 225), which provide a magnetic field in the range of 500 Gauss to 1,000 Gauss, including all values and ranges therein. The magnets may create magnetic fields along the length and surface of each target. A power supply 227a, 227b (herein after 227) to bias the magnetron 224 with a negative bias may also be provided.

To coat the piston rings, the piston rings may be provided as a substrate 202 into the process chamber 200. Once the substrate 202 is positioned on a work table 204 in the process chamber 200, the gas in the process chamber 200 may be evacuated and the gas pressure reduced to a pressure in the range of $10^{-5}$ torr to $10^{-6}$ torr, including all values and ranges therein, via the vacuum system 206. In embodiments, argon or another inert gas such as krypton, xenon, etc., may be supplied to the chamber through a gas supply port 208 at a rate of 1 to 200 standard cubic centimeters per minute (sccm), including all values and ranges therein, such as a rate of 5 to 50 sccm. The pressure in the chamber may be maintained at a range of 1 to 10 millitorrs, including all values and ranges therein, using the vacuum system 206. The inert gas may be continuously fed into the chamber through the duration of the sputtering process as well as through the deposition process.

The substrate 202 may optionally be sputter cleaned prior to coating by applying a bias to the work table 204, the substrate 202, an electron source 210, chamber wall 203 or a combination thereof. The negative bias applied to the work table or substrate may be in the range of 20 V to 200 Volts including all values and ranges therein, such as in the range of 40 V to 100 V. The bias applied to the work table or substrate may result in the drawing of ions from the argon gas or global plasma to the substrate and sputter cleaning the substrate. Ions may be drawn to the substrate or work table at 50 to 300 eV, including all values and increments therein.

The electron source may be negatively biased in the range of 50 V to 120 V, including all values and ranges therein, such as 75 V to 120 Volts etc. Applying a bias to the electron source 210 may result in electrons being ejected into the process chamber 200, causing collisions with the inert gas and separating the gas into ions and electrons, thus forming plasma. In addition, the chamber wall 203 may be positively biased in the range of 50 to 150 volts, including all values and ranges therein, such as 90 to 100 volts, relative to the filament. In applying a bias to the chamber wall 203, electrons may be drawn from the electron source 210 to the wall surfaces. The electrons may collide with neutral inert gas ions (e.g., argon ions) forming global plasma GP throughout the process chamber 200. The sputter cleaning process may occur for 10 to 200 minutes, including all values and ranges therein such as in the range of 60 to 90 minutes, removing surface oxides and/or contaminants.

During deposition the flow rate of inert gas into the chamber through the gas port 208 may be maintained in the range of 1 to 200 sccm, including all values and ranges therein, such as at a rate of 5 to 50 sccm. Nitrogen gas may also be supplied to the process chamber at a flow rate in the range of 40 to 60 sccm, including all values and ranges therein, such as 45 to 50 sccm, through the gas port 208. In embodiments, a separate gas port may be provided for supplying nitrogen. Acetylene may also be introduced into the process chamber 200. The acetylene may be introduced through gas port 208 or a separate gas port may be provided for the acetylene. If introduced, the acetylene may be provided at a flow rate in the range of 10 to 30 sccm, including all values and ranges therein, such as from 15 to 25 sccm, etc. Hexamethyldisilizane may also be introduced into the process chamber 200 through the precursor system at a rate in the range of 3 grams per hour to 9 grams per hour of hexamethyldisilizane may be introduced into the process chamber 200, including all values and ranges therein, such as from 3 to 6 grams per hour.

The biases applied to the substrate, worktable, chamber wall, and electron source may also be maintained during deposition. The negative bias applied to the work table or substrate may be in the range of 20 V to 200 V including all values and ranges therein, such as in the range of 40 V to 100 V. The electron source may be negatively biased in the range of 50 V to 120 V, including all values and ranges therein, such as 75 V to 120 Volts etc. The resulting current to the work table or substrate may be in the range of 0.5 A to 20 A, including all values and ranges therein. In addition, the chamber wall 203 may be positively biased in the range of 50 to 150 volts, including all values and ranges therein, such as 90 to 100 volts, relative to the filament. The bias to the chamber wall may be developed due to the relative charge of the electron source and the chamber wall and the energy source 201 may not be necessary to develop the bias.

The magnetron power supply 227 may negatively bias the magnetron 224 at a range of 0.05 kilowatts to 10 kilowatts, including all values and ranges therein, such as from 4 kilowatts to 10 kilowatts. The negative bias applied to the magnetron 224 may draw ions out of gasses proximate to the magnetron 224 forming magnetron plasma P1, P2. Electrons may become trapped within the magnetic fields generated by the magnets in the magnetrons increasing collisions with the gasses near the magnetrons and furthering ionization of the gasses. Due to the negative bias, ions from the magnetron P1, P2 and global plasmas GP may be accelerated toward the targets 226 with sufficient energy to remove or sputter atoms from the targets 226.

While atoms are sputtered from the magnetron targets, ions from the global plasma may bombard the surface of the substrate, including the sputtered atoms of titanium, and produce a protective coating including the atoms from the hexamethyldisilizane, nitrogen, and acetylene (if present), on the surfaces of the negatively biased substrate. The discharge conditions, i.e., the condition of the global plasma, may be effective to induce the reactive gas to react with the metal atoms. This then forms the Ti—Si—C—N coatings on the piston ring.

During deposition, the discharge current may be in the range of 1 to 10 A, including all values and ranges therein, such as in the range of 4.5 to 5.5 A, 5 A, etc. The discharge current may be understood as related to the plasma density or ion current. The bias voltage is in the range of 30 to 100 V including all values and ranges therein, such as 30 to 50

V, 40 V, etc. The bias voltage may be understood as a measure of ion energy. The bias current may be in the range of 0.50 to 1.00 A, including all values and ranges therein, such as 0.51 to 0.92 A. The bias current may be understood as a measure of ion flux.

Deposition may proceed from 3 to 10 hours, including all values and ranges therein, such as 3 to 5, 3.5 and 4. As noted above, the coatings may be formed at a thickness in the range of 10 to 40 micrometers, including all values and ranges therein. The coatings may be relatively uniform in thickness, wherein the thickness of the coatings may vary +/−20% or less of the average thickness across the coating surface.

In embodiments, prior to depositing the Ti—Si—C—N coatings a bond coat is deposited on the substrate. The bond coat may include titanium, titanium nitride, or a combination thereof. For example, the bond coat may include one or more alternating layers of titanium and titanium nitride. In other examples, the bond coat may include one or more layers of titanium nitride phases dispersed in a titanium matrix.

As noted, the deposited Ti—Si—C—N coatings preferably include titanium present in the range of 35 to 49 atomic percent, including all values and ranges therein, silicon present in the range of 1 to 5 atomic percent, including all values and ranges therein, carbon present in the range of 17 to 41 atomic percent, including all values and ranges therein, and nitrogen present in the range of 19 to 35 atomic percent, including all values and ranges therein. These formulations of the coatings exhibit a remarkable combination of properties, including a coefficient of friction of less than 0.15, a wear rate of less than $10 \times 10^{-6}$ mm$^3$/N/m, and a nanohardness in the range of 13.0 GPa to 30.0 GPa. The coefficient of friction is measured using the Plint TE77 testing apparatus using a 10W-30 oil maintained at 35° C. as a lubricant, a normal force of 30 N, and a sliding frequency of 5 to 20 Hz. The wear rate is measured against an alumina ball of 0.25 inches in diameter at a load of 1 N at 100 rpm in a dry environment.

In embodiments, particularly where acetylene is not present in the process environment, the coatings preferably include a composition of 43.5 to 46.7 atomic percent titanium, 1.58 to 3.04 atomic percent silicon, 30.9 to 34.2 atomic percent nitrogen, and 17.6 to 22.5 atomic percent carbon. In such embodiments, the coefficient of friction may be in the range of 0.21 to 0.26 and the wear rate may be in the range of $3.02 \times 10^{-6}$ mm$^3$/N/m to $7.35 \times 10^{-6}$ mm$^3$/N/m, wherein the coefficient of friction and wear rate as measured against an alumina ball of 0.25 inches in diameter at a load of 1 N at 100 rpm in a dry environment.

In additional embodiments, where acetylene is introduced to the process environment in the range of 10 sccm to 30 sccm, the coatings preferably include a composition of 38 to 48.4 atomic percent titanium, 1.84 to 2.34 atomic percent silicon, 21.59 to 28.09 atomic percent nitrogen, and 21.5 to 38.1 atomic percent carbon. In such embodiments, the Plint TE77 coefficient of friction is less than 0.15, including all values and ranges therein, such as in the range of 0.05 to 0.10, as measured using 10W-30 oil maintained at 35° C. as a lubricant, using a normal force of 30 N applied and a sliding frequency of 5 to 20 Hz. The pin-on-disc coefficient of friction may be in the range of 0.21 to 0.33. The wear rate may be in the range of $4.59 \times 10^{-6}$ mm$^3$/N/m to $5.02 \times 10^{-6}$ mm$^3$/N/m. The pin-on-disc coefficient of friction and wear rate being measured against an alumina ball of 0.25 inches in diameter at a load of 1 N at 100 rpm in a dry environment. The nanohardness may be in the range of 14.5 GPa to 16.7 GPa.

In further embodiments, where acetylene is introduced to the process environment in the range of 15 sccm to 25 sccm, the coatings preferably include a composition of 35.6 to 43.3 atomic percent titanium, 2.33 to 4.12 atomic percent silicon, 19.64 to 25.34 atomic percent nitrogen, and 29.0 to 40.8 atomic percent carbon. In such embodiments, the Plint TE77 coefficient of friction is less than 0.15, including all values and ranges therein, such as in the range of 0.05 to 0.10, as measured using a 10W-30 oil maintained at 35° C. as a lubricant, using a force of 30 N and a sliding frequency of 5 to 20 Hz. The pin-on-disc coefficient of friction may be in the range of 0.16 to 0.21 and the wear rate may be in the range of $3.84 \times 10^{-6}$ mm$^3$/N/m to $5.78 \times 10^{-6}$ mm$^3$/N/m, wherein the coefficient of friction and wear rate as measured against an alumina ball of 0.25 inches in diameter at a load of 1 N at 100 rpm in a dry environment. The nanohardness may be in the range of 13.8 GPa to 14.5 GPa.

In yet further embodiments, where acetylene is introduced to the process environment, such as at a flow rate of 15 to 25 sccm and preferably 18 to 22 sccm and more preferably 20 sccm, the coatings preferably include titanium present in the range of 41 to 43.3 atomic percent, silicon present in the range of 2.3 to 3.8 atomic percent, carbon present in the range of 29 to 33 atomic percent, and nitrogen present in the range of 22 to 25 atomic percent. In such embodiments, the Plint TE77 coefficient of friction is less than 0.15, including all values and ranges therein, such as in the range of 0.05 to 0.10, as measured using a 10W-30 oil maintained at 35° C. as a lubricant, using a normal force of 30 N, and a sliding frequency of 5 to 20 Hz. The pin-on-disc coefficient of friction may be in the range of 0.21 to 0.22 and the wear rate may be in the range of $4.69 \times 10^{-6}$ mm$^3$/N/m to $5.78 \times 10^{-6}$ mm$^3$/N/m, wherein the coefficient of friction and wear rate as measured against an alumina ball of 0.25 inches in diameter at a load of 1 N at 100 rpm in a dry environment. The nanohardness may be in the range of 10 to 20 GPa, including all values and ranges therein, and preferably 14.5 GPa.

EXAMPLES

Samples

20 Stainless steel (SS) disc coupon samples (1 inch×1 inch×⅛ inch) and steel keystone 137 mm bore piston rings were used in the examples herein. The coupons were used for the coating microstructural analyses and pin-on-disc wear tests, while the rings were tested in the Plint TE77 apparatus and single cylinder engine test.

Coating Process

Ti—Si—C—N coatings were formed using the process parameters described below in Table 1. Prior to coating deposition, each sample substrate was cleaned by etching with inert ions using a global plasma at a bias voltage of −120 V. The voltage and current applied on the filaments during sputter cleaning were 20 V and 40 A. After ion etching, a Ti/TiN bond layer was deposited to enhance the adhesion strength of the coatings.

To form the coating two titanium targets were used in DC magnetron sputtering at a 4 kW average power (MDX, 10 kW, Advanced Energy, Inc.) positioned in the process chamber. Argon, nitrogen, hexamethyldisilizane (HMDSN) and acetylene (C$_2$H$_2$) gasses were supplied in the process chamber. Tungsten filaments were used as an electron source. Argon flow rate was maintained at 190 sccm. The chamber pressure was maintained at about 3 m Torr in all samples and trials. Coatings having a thickness in the range of 12 to 15 microns were deposited for a deposition period of 3 hours.

TABLE 1

Processing Parameters

| Sample | Deposit Time (hr) | 1$^{st}$ Target Power (kW) | 2$^{nd}$ Target Power (kW) | Discharge Current (A) | Bias Voltage (V) | Bias Current (A) | Flow Rate N$_2$ (sccm) | Flow Rate HMDSN (g/hr) | Flow Rate C$_2$H$_2$ (sccm) |
|---|---|---|---|---|---|---|---|---|---|
| 1 | 3 | 4 | 4 | 5 | 40 | 0.66 | 50 | 3 | |
| 2 | 4 | 4 | 4 | 5 | 40 | 0.65 | 50 | 6 | |
| 3 | 5 | 4 | 4 | 5 | 40 | 0.92 | 50 | 12 | |
| 4 | 5 | 4 | 4 | 5 | 40 | 0.82 | 50 | 15 | |
| 5 | 3.5 | 4 | 4 | 5 | 40 | 0.85 | 50 | 18 | |
| 6 | 3 | 4 | 4 | 5 | 40 | 0.51 | 50 | 1.5 | |
| 7 | 3 | 4 | 4 | 5 | 40 | 0.57 | 45 | 3 | |
| 8 | 3 | 4 | 4 | 5 | 40 | 0.67 | 45 | 3 | 5 |
| 9 | 3 | 4 | 4 | 5 | 40 | 0.58 | 45 | 3 | 10 |
| 10 | 3 | 4 | 4 | 5 | 40 | 0.6 | 45 | 3 | 15 |
| 11 | 3 | 4 | 4 | 5 | 40 | 0.54 | 45 | 3 | 20 |
| 12 | 3 | 4 | 4 | 5 | 40 | 0.58 | 45 | 3 | 30 |
| 13 | 3 | 4 | 4 | 5 | 40 | 0.54 | 45 | 3 | 40 |
| 14 | 3 | 4 | 4 | 5 | 40 | 0.57 | 45 | 3 | 50 |
| 15 | 3 | 4 | 4 | 5 | 40 | 0.54 | 45 | 3 | 17.5 |
| 16 | 3 | 4 | 4 | 5 | 40 | 0.54 | 45 | 3 | 20 |
| 17 | 3 | 4 | 4 | 5 | 40 | 0.54 | 45 | 3 | 22.5 |
| 18 | 3 | 4 | 4 | 5 | 40 | 0.54 | 45 | 3 | 25 |

Three groups of coatings were deposited. In the first group, samples 1-7, the flow rate of hexamethyldisilizane (HMDSN) was varied, while no acetylene (C$_2$H$_2$) was introduced. In the second group, samples 8-14, the flow rate of acetylene (C$_2$H$_2$) was varied from 5 to 50 sccm while the flow rate of hexamethyldisilizane was maintained at 3 g/hr. In the third group, samples 15-18, the flow rate of acetylene (C$_2$H$_2$) was varied from 17.5 to 25 sccm while the flow rate of hexamethyldisilizane was maintained at 3 g/hr. The flow rate of nitrogen (N$_2$) was maintained at 50 sccm for samples 1 through 6 and 45 sccm for samples 7 through 18.

Experimental Procedures

Scanning electron microscopy (SEM) using a Philips XL 40 scanning electron microscope was used to study the coating microstructure and morphology. Cross-sections were examined using SEM to determine coating thickness. In addition, energy dispersive spectroscopy (EDS) was used to perform elemental analysis. X-ray diffractions were generated using a Siemens Kristalloflex 805 diffractometer using Cu radiation (45 kV and 30 mA) in Bragg-Brentano mode.

Rockwell C indentation at 150 kg load was performed on the coatings and then studied using SEM. Nanoindentation was also performed on selected samples to study the coating nanohardness and modulus of elasticity. The mean hardness and Young's modulus of the Ti—Si—C—N coatings were measured using a nanoindenter (NanoIndenter XP™, MTS Systems Corporation) with a diamond Berkovich tip. The indentation depth was 300 nm, which was less than 10% of the thickness of the coating to avoid the effect from the substrate deformation. The hardness (H) and Young's modulus (E) of the coating were calculated by the nanoindenter software (TestWorks™ Ver.4.06A) based on the model of Oliver and Phan from the load-displacement curves. Twelve measurements were made to obtain the mean value and the standard deviation.

The adhesion of the coatings was measured by the Rockwell-C indentation test (RC) using a standard Rockwell-C hardness tester. A Rockwell C diamond stylus (cone apex angle 120°, tip radius R=0.2 mm) was used to perform the tests with an applied load of 150 kg on the stylus. After the tests, the morphology of the indentations was examined using SEM to evaluate coating damage around the indents. The damage of the coating was compared with a HF adhesion strength quality as standardized in the VDI guidelines 3198, (1991).

Figure 3:
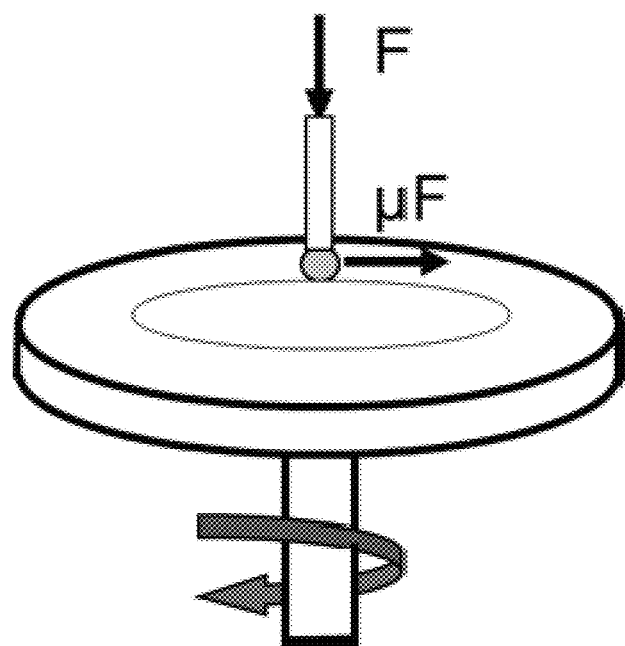
FIG. 3 illustrates a schematic of a pin-on-disk tribometer.

Coating tribology was measured using a pin-on-disc tribometer, a schematic of which is illustrated in FIG. 3. This test was performed on the stainless steel disc coupons for screening purposes. The counter pin used was an alumina ball of 6 mm in diameter and the applied load F was 1 N, and the rotating speed was 100 rpm. The testing occurred in a non-lubricated environment for 10,000 cycles.

Figure 4A:
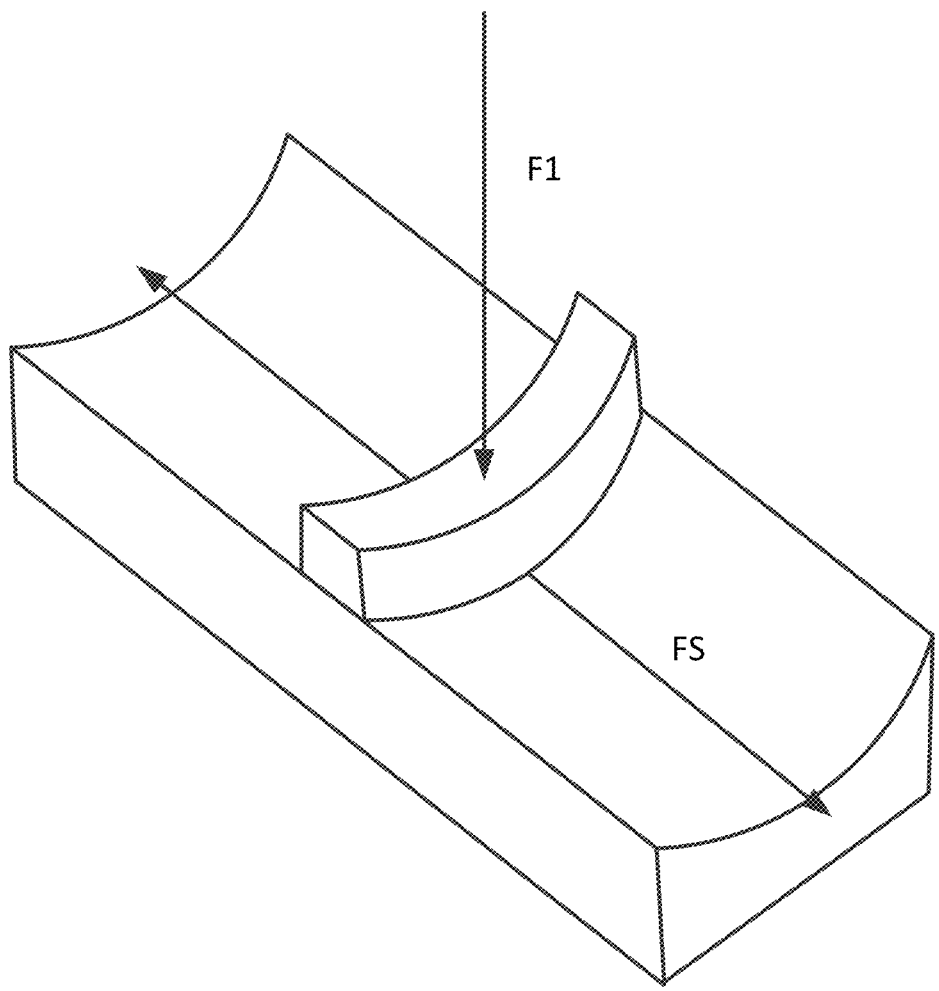
FIG. 4a illustrates a schematic of the Plint TE77 test.
Figure 4B:
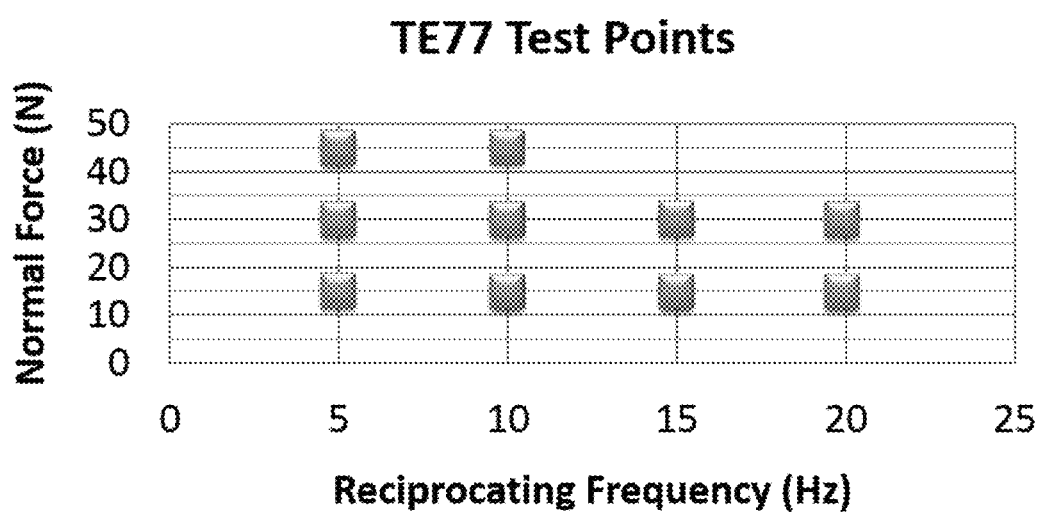
FIG. 4b illustrates the testing conditions for Plint TE77 testing.

A few of the coated rings were also tested using the Plint TE77 testing apparatus, which was performed using diesel engine oil as a lubricant. The oil was Shell ROTELLA, which is 10w-30 oil, and had been drained from a prototype high efficiency heavy duty diesel engine. This oil was used to provide stable friction measurements. During testing, the oil temperature was maintained at 35° C. to provide the desired viscosity. FIG. 4a illustrates a schematic of the test, wherein a sample is slide back and forth FS against a sliding surface at a given frequency under a normal force F1, which is applied normal to the sliding surface. FIG. 4b illustrates the testing points, wherein the test was performed at frequencies of 5 Hz, 10 Hz, 15 Hz and 20 Hz and normal forces of 15 N, 30 N and 45 N.

Figure 5:
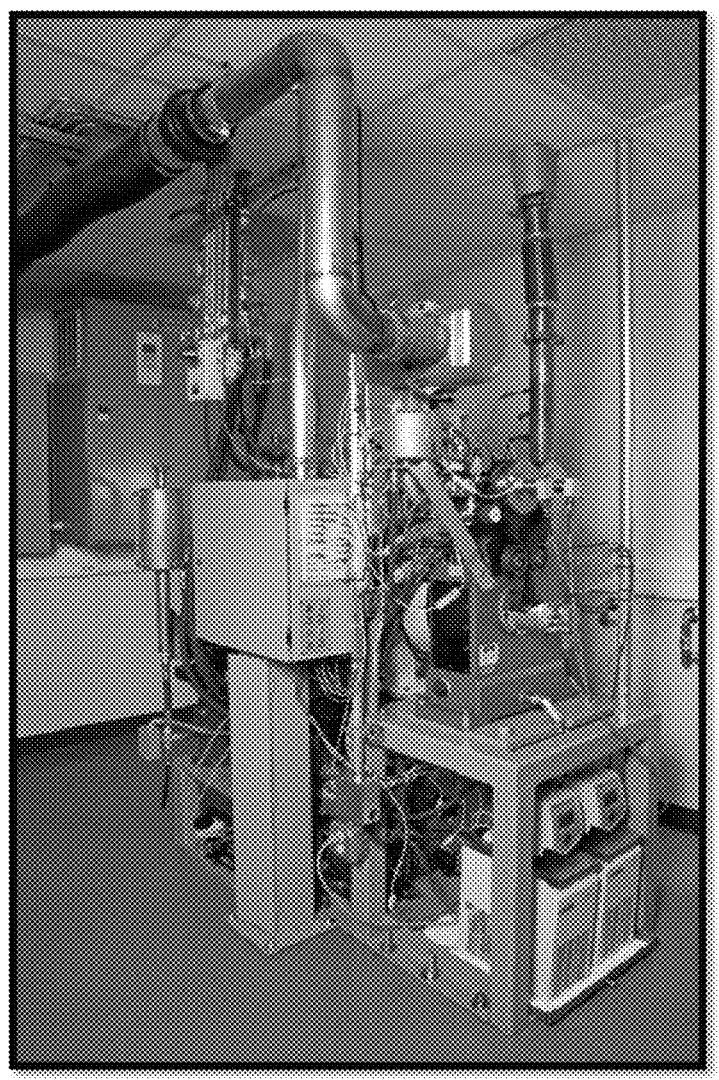
FIG. 5 illustrates an image of a single cylinder Ricardo Hydra gasoline engine.

After Plint TE77 testing the deposition parameters were selected and a few rings were selected and tested in a single cylinder Ricardo Hydra gasoline engine shown in FIG. 5. The test was conducted using the following parameters: 0.5 L displacement, 86 mm piston, 86 mm stroke, and 10.5:1 compression ratio. The valve train is characterized as a direct-acting lifter design, twin overhead cam. Operating parameters of the engine include: 5w20 fully formulated engine oil, 100° C. engine coolant in and out temperature, 250 kPa engine oil pressure, 65° C. engine oil gallery temperature, and 2000 rpm reciprocation. The engine was run over a 24 hour period using a combination of motoring and firing at steady and increasing speeds and loads.

Figure 6:
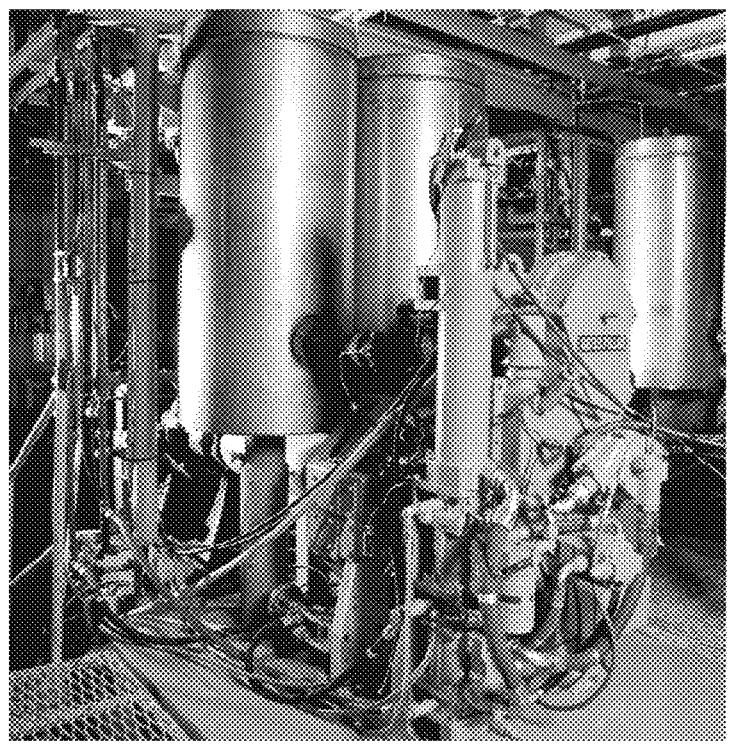
FIG. 6 illustrates a single cylinder Caterpillar oil test engine.

Heavy duty diesel engine testing was then performed using piston rings coated according to sample 11 for the top and second compression rings (rings 102, 104 illustrated in FIG. 1). The engine chosen was a single cylinder oil test engine as shown in FIG. 6 using one cylinder from a Caterpillar 15 L engine. The engine had a 137 mm bore, articulated steel piston with aluminum skirt, and keystone top ring. The engine was operated at a peak torque for 120 hours of continuous testing. Peak torque (approximately 385 Nm) occurs at 1200 RPM. An oil drain from another engine which contained 4.1% soot by mass was used to accelerate the wear process. This test was operated with an engine oil temperature of 125° C. and oil gallery pressure of 350 kPa. During testing an inductively coupled plasma (ICP) analysis was performed to check for wear materials every 12 hours, providing an indicator of wear rate for different parameters such as the coating and base metal.

Results and Discussion
Coating Properties and Elemental Composition

Tables 2 and 3 provide the experimental results indicating the properties of the coatings and elemental coating composition.

TABLE 2

Coating Properties

| Sample | Flow Rate HMDSN (g/hr) | Flow Rate $C_2H_2$ (sccm) | Thickness (μm) | Deposition Rate (μm/hr) | COF (pin-on-disc) | Wear Rate ($\times 10^{-6}$ $mm^3$/N/m) | Nano-Hardness (GPa) | Modulus Elasticity (GPa) |
|---|---|---|---|---|---|---|---|---|
| 1 | 3 | | | | 0.25 | 5.1 | 29.4 | 350 |
| 2 | 6 | | | | 0.26 | 3.02 | 25.8 | 305 |
| 3 | 12 | | 20.1 | 4.02 | 0.4 | 14.6 | 21.5 | 311 |
| 4 | 15 | | 19.6 | 3.92 | 0.7 | 17.8 | 20.6 | 302 |
| 5 | 18 | | 13.1 | 3.74 | 0.9 | 25.6 | 8.3 | 149 |
| 6 | 1.5 | | 17.5 | 5.83 | 0.93 | 36.1 | 27.6 | 334 |
| 7 | 3 | | 11.1 | 3.70 | 0.21 | 7.35 | | |
| 8 | 3 | 5 | 20 | 6.67 | 0.55 | 4.33 | 21 | 295 |
| 9 | 3 | 10 | 16.5 | 5.50 | 0.33 | 4.59 | 16.7 | 255 |
| 10 | 3 | 15 | 13.5 | 4.50 | 0.24 | 5.02 | | |
| 11 | 3 | 20 | 14.4 | 4.80 | 0.22 | 4.69 | 14.5 | 183 |
| 12 | 3 | 30 | 16.5 | 5.50 | 0.21 | 4.71 | | |
| 13 | 3 | 40 | 10.1 | 3.37 | 0.19 | 2.96 | 13.4 | 133 |
| 14 | 3 | 50 | 19.5 | 6.50 | 0.16 | 12.3 | | |
| 15 | 3 | 17.5 | 16.6 | 5.53 | 0.18 | 4.59 | | |
| 16 | 3 | 20 | 16.1 | 5.37 | 0.21 | 5.78 | | |
| 17 | 3 | 22.5 | 16.2 | 5.40 | 0.19 | 4.59 | | |
| 18 | 3 | 25 | 17.4 | 5.80 | 0.19 | 3.84 | 13.8 | 138 |

TABLE 3

Elemental Compositions of the Coatings

| Sample | Flow Rate HMDSN (g/hr) | Flow Rate $C_2H_2$ (sccm) | C (at %) | N (at %) | Si (at %) | Ti (at %) |
|---|---|---|---|---|---|---|
| 1 | 3 | | | | | |
| 2 | 6 | | 22.5 | 30.98 | 3.04 | 43.5 |
| 3 | 12 | | 20 | 32.76 | 4.22 | 43 |
| 4 | 15 | | 19.5 | 31.84 | 5.04 | 43.6 |
| 5 | 18 | | 22 | 28.44 | 6.46 | 43.1 |
| 6 | 1.5 | | 17.6 | 35.59 | 1.1 | 45.7 |
| 7 | 3 | | 17.6 | 34.2 | 1.58 | 46.7 |
| 8 | 3 | 5 | 20.8 | 27.89 | 1.28 | 50 |
| 9 | 3 | 10 | 21.5 | 28.09 | 2.05 | 48.4 |
| 10 | 3 | 15 | 24 | 27.51 | 1.84 | 46.6 |
| 11 | 3 | 20 | 29 | 25.34 | 2.33 | 43.3 |
| 12 | 3 | 30 | 38.1 | 21.59 | 2.34 | 38 |
| 13 | 3 | 40 | 46.7 | 17.48 | 2.42 | 33.4 |
| 14 | 3 | 50 | 55.2 | 15.97 | 1.96 | 26.9 |
| 15 | 3 | 17.5 | 30.4 | 23.57 | 3.77 | 42.3 |
| 16 | 3 | 20 | 32.8 | 22.29 | 3.83 | 41.1 |
| 17 | 3 | 22.5 | 36.3 | 20.6 | 4.12 | 39 |
| 18 | 3 | 25 | 40.8 | 19.64 | 3.91 | 35.6 |

Figure 7:
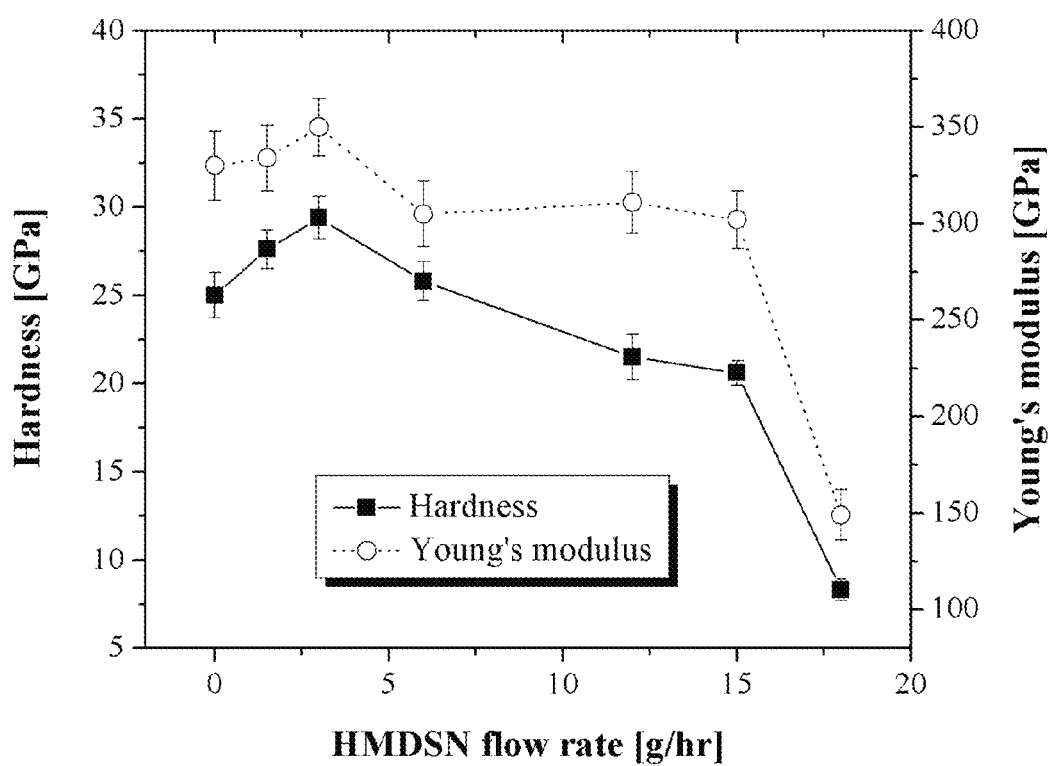
FIG. 7 is a graph of the measured nanohardness and Young's modulus of samples 1 through 7.
Figure 8:
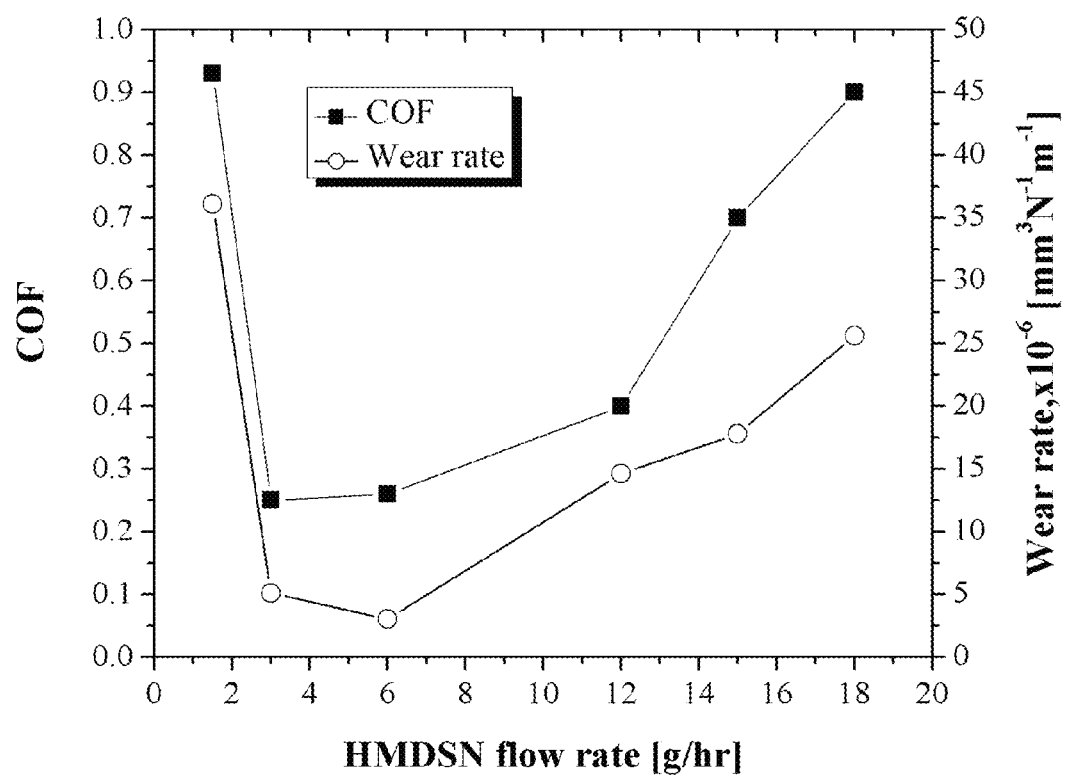
FIG. 8 is a graph of the coefficient of friction and wear rate obtained of samples 1 through 7 measured using the pin-on-disk tribometer.

The nanohardness and modulus of samples 1 through 7 are graphed in FIG. 7 relative to the flow rate of the hexamethyldisilizane. As can be seen in the graph, both hardness and modulus reach a maximum at 3 g/hr. As illustrated in FIG. 8 the coefficient of friction and wear rate obtained using pin-on-disk tribology is graphed relative to the flow rate of the hexamethyldisilizane. As can be seen in the graph, the coefficient of friction is lowest when the hexamethyldisilizane flow rate is at 3 grams per hour and remains below 0.4 at flow rates between 3 grams per hour and 12 grams per hour. Similarly, the wear rate is lowest when the hexamethyldisilizane flow rate is in the range of 3 grams per hour and 6 grams per hour, remaining below $5 \times 10^{-6}$ $mm^3$/N/m. Based on the data, it appears that at a flow rate of hexamethyldisilizane in the range of 3 grams per hour and 9 grams per hour the coefficient of friction remains below 0.4 and the wear rate remains below $10 \times 10^{-6}$ $mm^3$/N/m.

Figure 9:
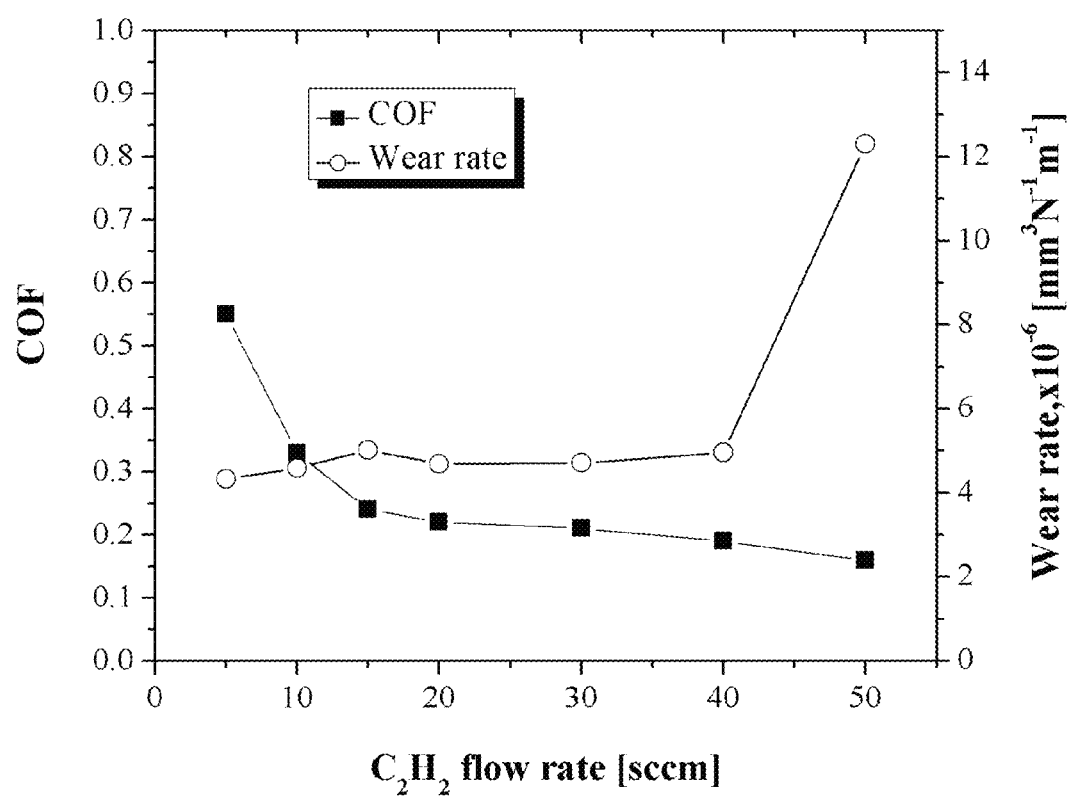
FIG. 9 is a graph of the effect of acetylene flow rate on the coefficient of friction and wear rate of sample 8 through 14.

As a flow rate of 3 grams per hour of hexamethyldisilizane provided better properties overall, the hexamethyldisilizane flow rate was maintained at 3 grams per hour while acetylene was introduced into the system at varying flow rates in samples 8 through 14. FIG. 9 illustrates the effect of acetylene flow rate on the coefficient of friction and the wear rate. As can be seen, in FIG. 9, the coefficient of friction is below 0.4 at acetylene flow rates of 10 sccm or greater. However, the wear rate increases at an acetylene flow rate of 50 sccm to greater than $12 \times 10^{-6}$ $mm^3$/N/m. At 40 sccm and below, the wear rate remains below about $5 \times 10^{-6}$ mm$^3$/N/m. In view of this data, it appears that acetylene may be introduced at a flow rate in the range of 10 sccm to 40 sccm, including all values and ranges therein.

Figure 10:
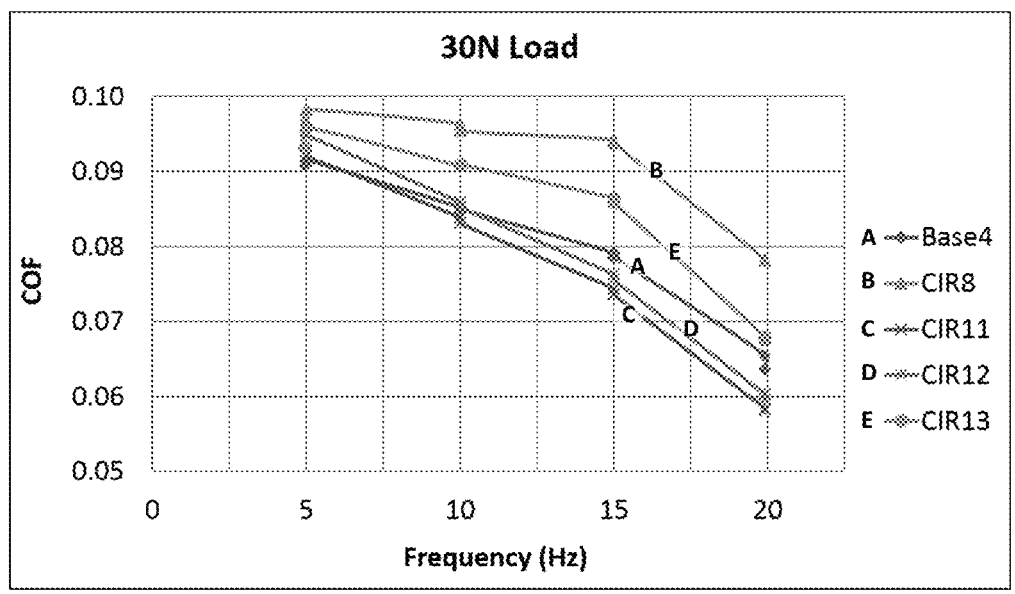
FIG. 10 is a graph illustrating the effect of sample preparation conditions on the coefficient of friction as measured by the Plint TE77 tribometer.

The coefficient of friction using the Plint TE77 test was also measured for samples 8, 11, 12 and 13 and the results are presented in FIG. 10. As seen in this figure, the coefficient of friction was lower when the flow rate of acetylene was in the range of 10 to 30 sccm. At these rates, the coefficients of friction were similar, and lower at higher frequencies, than that of the baseline of cast iron as seen in FIG. 10. Using flow rates of 5 sccm and 40 sccm resulted in a relatively higher coefficient of friction and a relatively higher wear rate, respectively.

Figure 11:
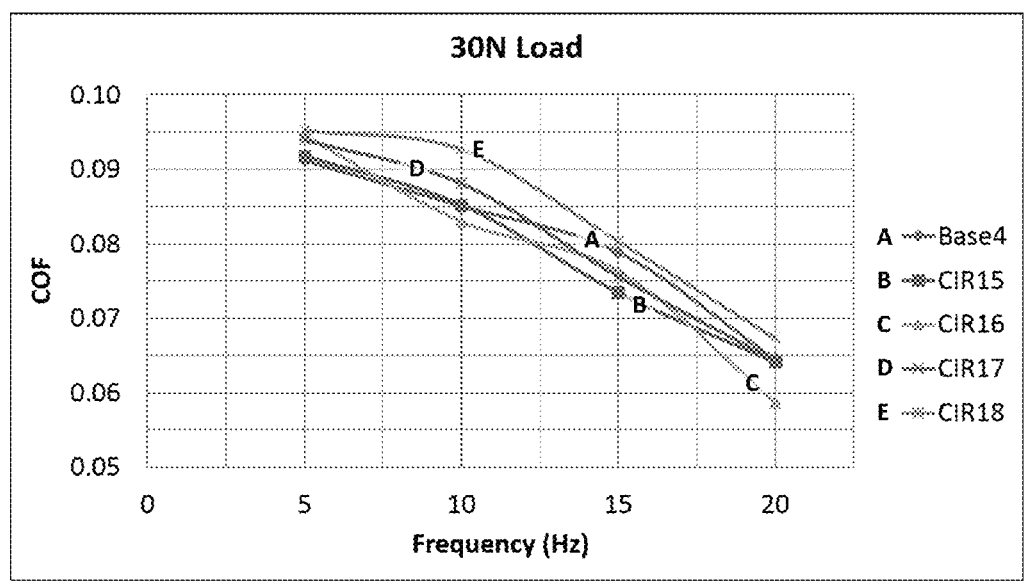
FIG. 11 is a graph illustrating the effect of sample preparation conditions on the coefficient of friction as measured by the Plint TE77 tribometer.

In view of the above, the acetylene flow rate was varied at finer steps from 17.5 to 25 sccm. Note that sample 16 is a repeat of sample 11. FIG. 11 illustrates the results of Plint TE77 testing. The performance of the coatings appears to be similar and, at most frequencies, below that of the cast iron baseline material seen in the graph. Specifically, it appears that at 10 Hz, the coefficient of friction was below 0.09 for the samples tested, whereas the coefficient of friction was above 0.09 for cast iron. Similarly at 15 Hz, the coefficient of friction of the samples appeared to be below 0.08, whereas the coefficient of friction of the cast iron appears to be 0.08. At 20 Hz, the coefficient of friction of the samples appears to be 0.065 or below, whereas the coefficient of friction of the cast iron is above 0.065.

Figure 12:
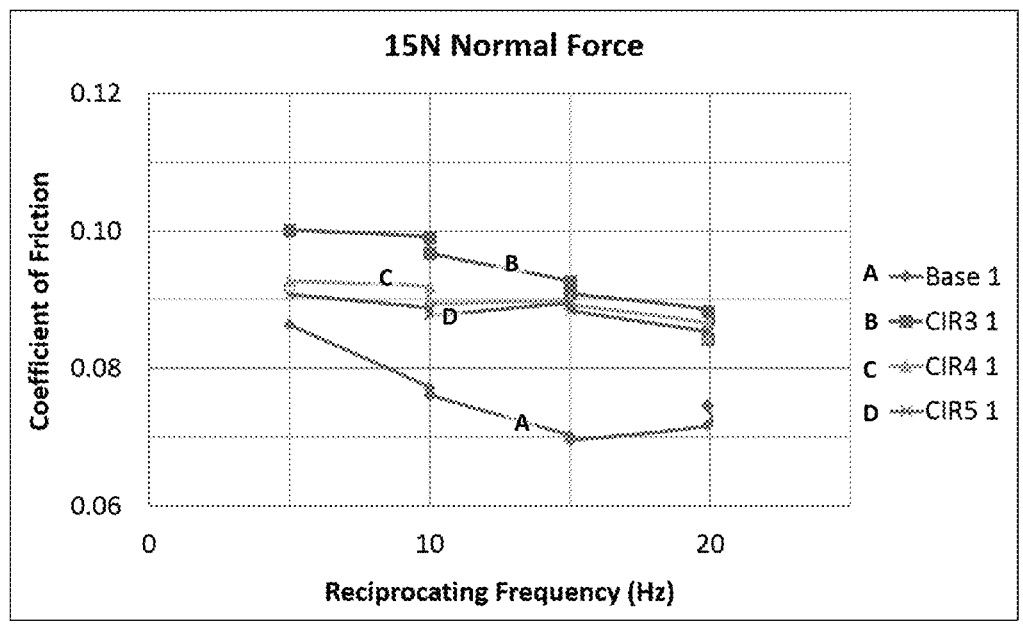
FIG. 12 is a graph illustrating the effect of sample preparation conditions on the coefficient of friction as measured by the Plint TE77 tribometer.

FIG. 12 illustrates the coefficient of friction as measured by the Plint TE77 test for varying amounts of hexamethyldisilizane in samples formed without acetylene present in the process chamber, samples 3, 4 and 5. As seen in FIG. 12, the coefficient of friction of these samples was relatively higher than that of the cast iron. Note that these samples were tested at a normal force of 15 N whereas all previous samples in FIGS. 10 and 11 were tested at 30 N.

Figure 13A:
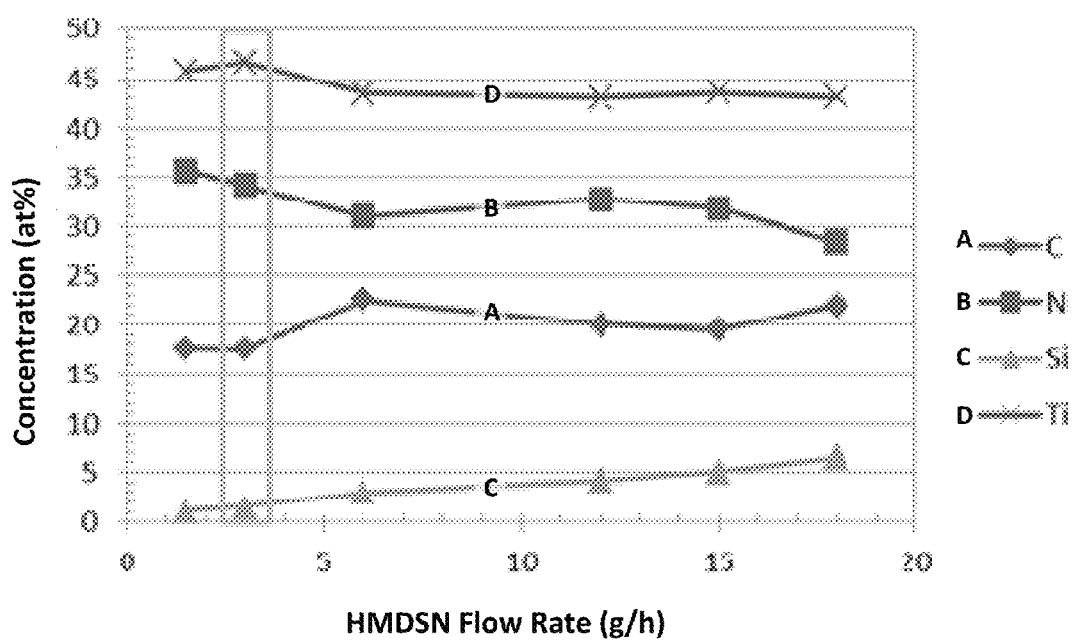
FIG. 13a is a graph illustrating the effect of sample preparation conditions on the composition of the coatings.
Figure 13B:
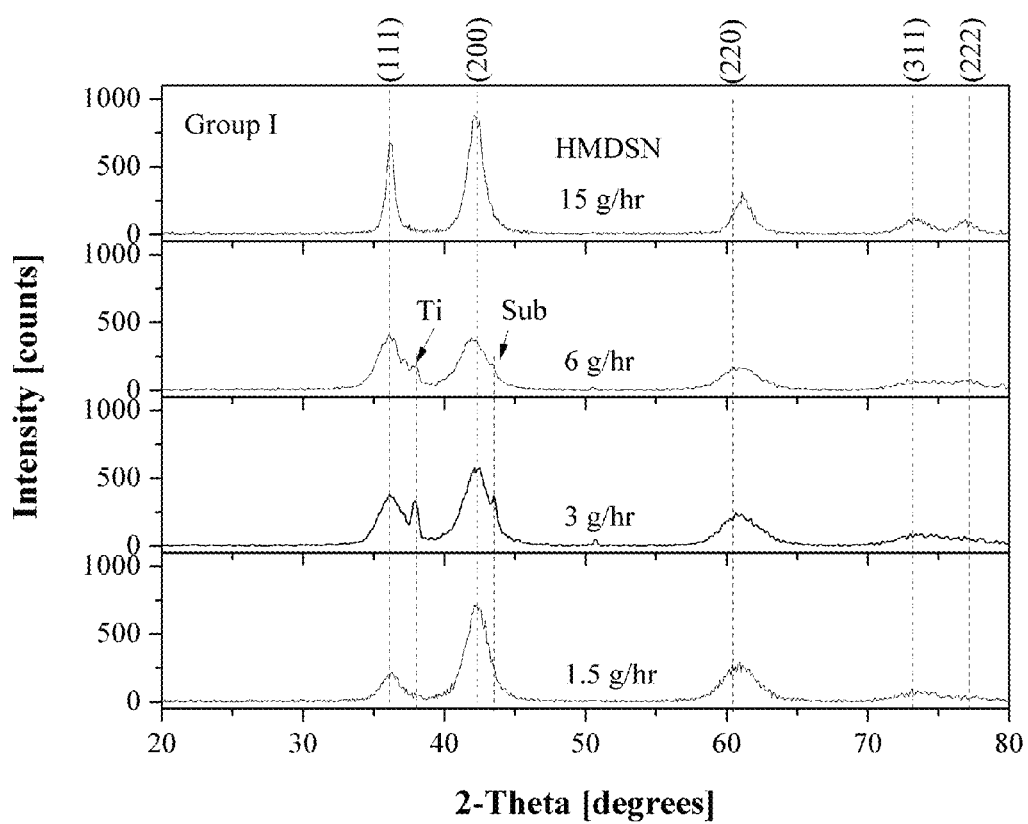
FIG. 13b includes XRD patterns illustrating the effect of sample preparation conditions on the composition of the coatings.

With regard to the elemental compositions produced by the coating methods, FIG. 13a illustrates the effect of HMDSN flow rate on the coating composition for samples 2 through 6 and 7. The amount of titanium was highest at 3 g/hr and the silicon content increased relatively linearly with increasing hexamethyldisilizane flow rate was kept the same. The highlighted area illustrates the flow rate where the properties were relatively better overall. FIG. 13b presents the XRD patterns of the Ti—Si—C—N coatings deposited with different HMDSN flow rates. All Ti—Si—C—N coatings exhibited polycrystalline structure. The coating deposited at a HMDSN flow rate of 1.5 g/hr exhibited a face center cubic (FCC) phase structure with (111), (200), (220) diffraction peaks. The (200) diffraction peaks showed the highest intensity. As the HMDSN flow was increased to 3 and 6 g/hr, the intensity of the (200) peak decreased with a peak broadening for all diffraction peaks. In addition, the diffraction peaks for the Ti adhesion layer and the steel substrate were also shown in the XRD patterns. Since the thickness of the coatings is similar, the appearance of the Ti diffraction peaks in the XRD patterns indicated an increase in the amorphous phase in the Ti—Si—C—N coatings as the HMDSN flow rate increased, as X-ray has a deep penetration depth in amorphous phases.

Figure 14A:
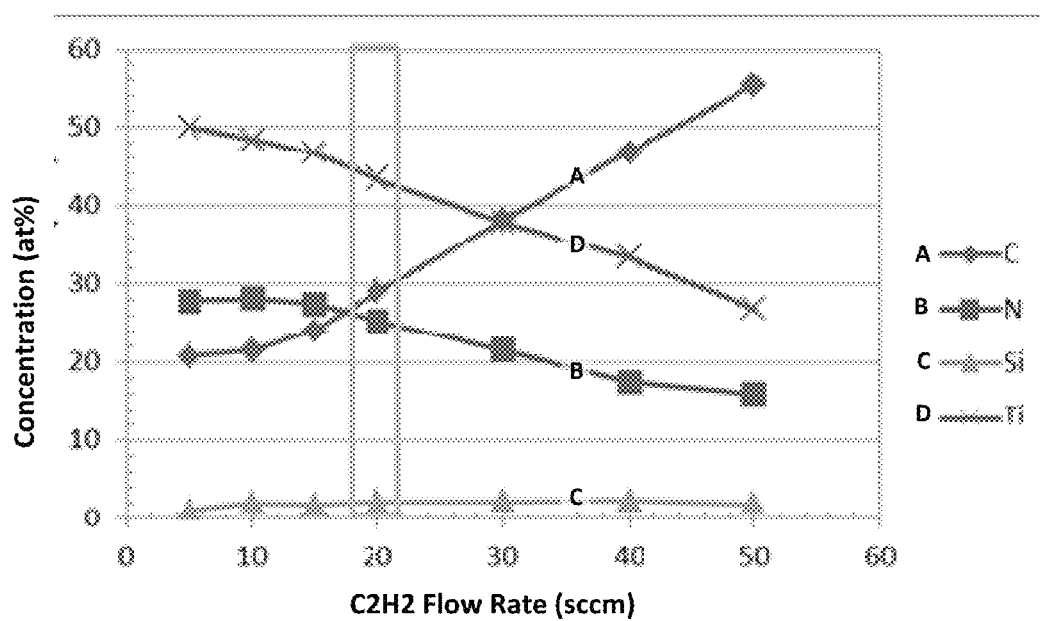
FIG. 14a is a graph illustrating the effect of sample preparation conditions on the composition of the coatings.
Figure 14B:
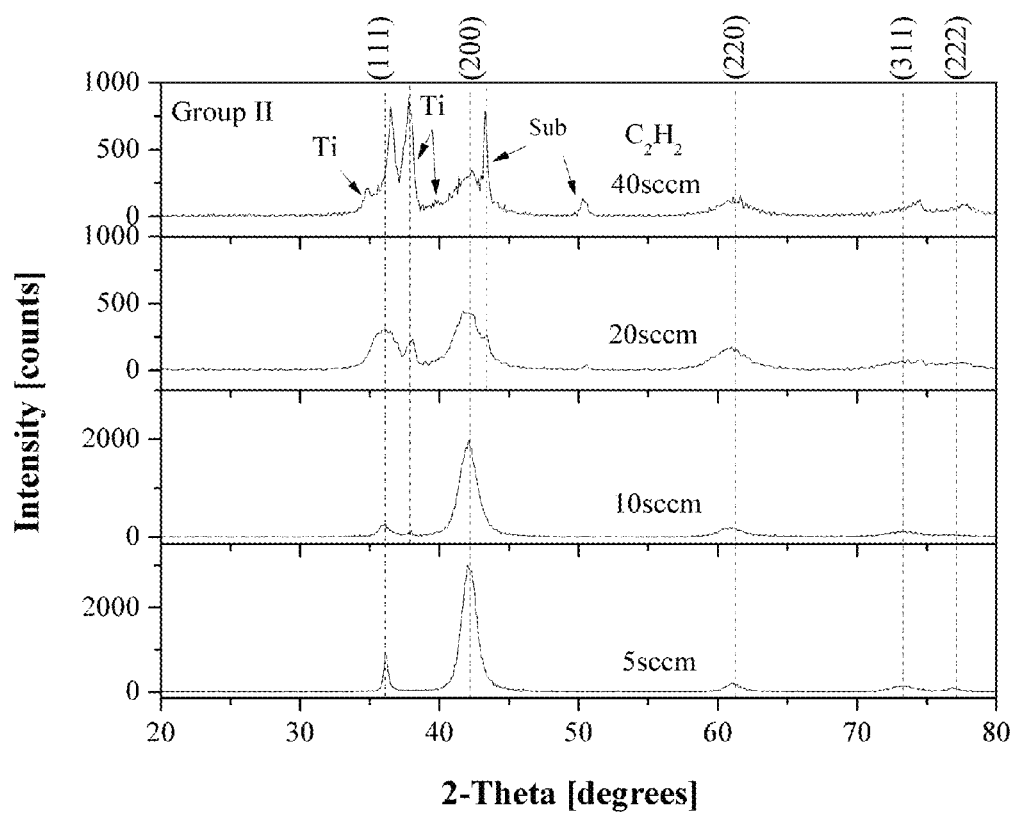
FIG. 14b includes XRD patterns illustrating the effect of sample preparation conditions on the composition of the coatings.

FIGS. 14a and 14b illustrate the effect of acetylene flow rate on the coating composition for samples 8 through 14. As seen in FIG. 14a, the concentration of C increases with increasing acetylene flow rate. Further, the concentrations of Ti and N decrease and Si remains fairly consistent as the acetylene flow rate increased. The highlighted area illustrates the flow rate where the properties were relatively better overall. FIG. 14b presents the XRD patterns. These coatings also exhibited an FCC phase structure with (111), (200) and (220) diffraction peaks. As the acetylene flow was increased, the intensity of the (200) peak decreased accompanied with an increase in the (111) peak. The diffraction peaks for the titanium adhesion layer and the steel substrate increased significantly as the acetylene flow rate was increase, which is related to an increase in the amorphous carbon phase in the coatings.

SEM Imaging

Figure 15A:
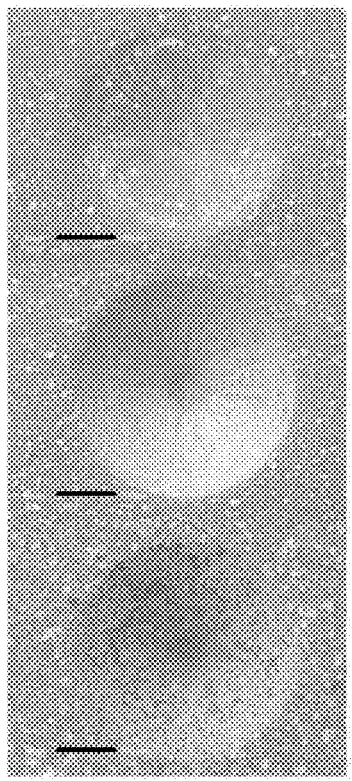
FIG. 15a includes SEM images of nanoindentations on the coatings of, from top to bottom, samples 3, 4, and 5, the scale set forth in the lower left hand corner is 200 µm.
Figure 15B:
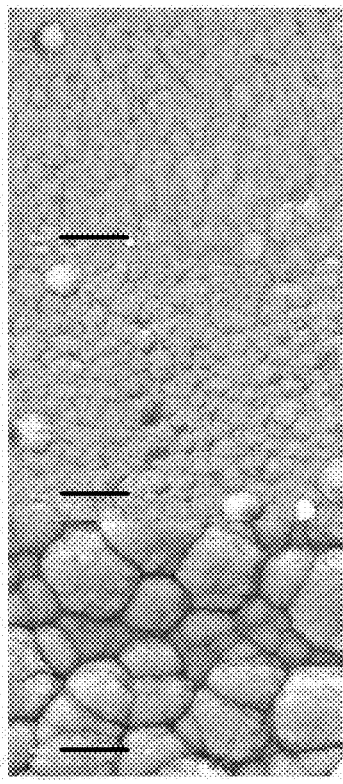
FIG. 15b includes SEM images of the surface of the coatings of, from top to bottom, samples 3, 4, and 5, the scale set forth in the lower left hand corner is 5 µm.
Figure 15C:
FIG. 15c includes SEM images of cross-sections of the coatings of, from top to bottom, samples 3, 4, and 5, the scale set forth in the lower left hand corner is 5 µm.

FIGS. 15a, 15b and 15c illustrate SEM images of samples 3, 4 and 5 produced using hexamethyldisilizane without acetylene. In each figure, sample 3 is at the top, sample 4 is in the middle, and sample 5 is at the bottom of the images. FIG. 15a include images of Rockwell C (RC) indentation on the coating surfaces, FIG. 15b includes images of the coating surfaces without indentation, and FIG. 15c includes images of cross-sectional views of the coatings. Overall, the coatings include many droplets on the surface. In addition, the coatings exhibit columnar structure. Further, at a high hexamethyldisilizane flow rate, the coating becomes coarse. Finally, delamination is not observed around the RC indents indicating adhesion is relatively good.

Figure 16A:
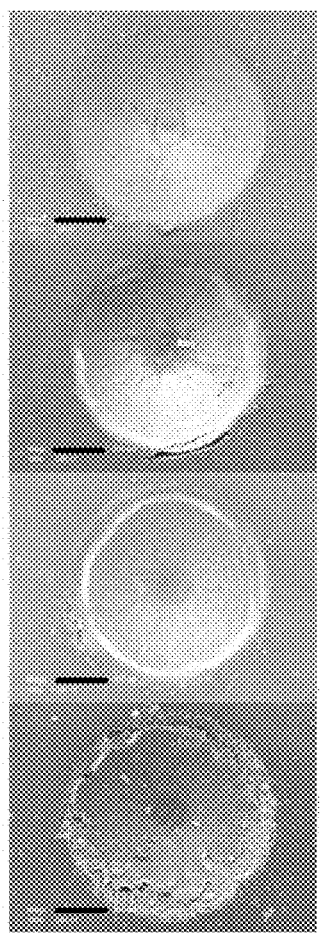
FIG. 16a includes SEM images of nanoindentations on the coatings of, from top to bottom, samples 8, 11, 12 and 13, the scale set forth in the lower left hand corner is 200 µm.
Figure 16B:
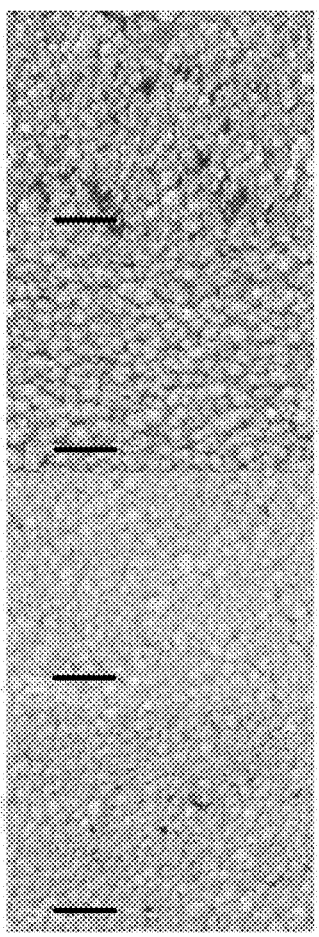
FIG. 16b includes SEM images of the surface of the coatings of, from top to bottom, samples 8, 11, 12 and 13, the scale set forth in the lower left hand corner is 5 µm.
Figure 16C:
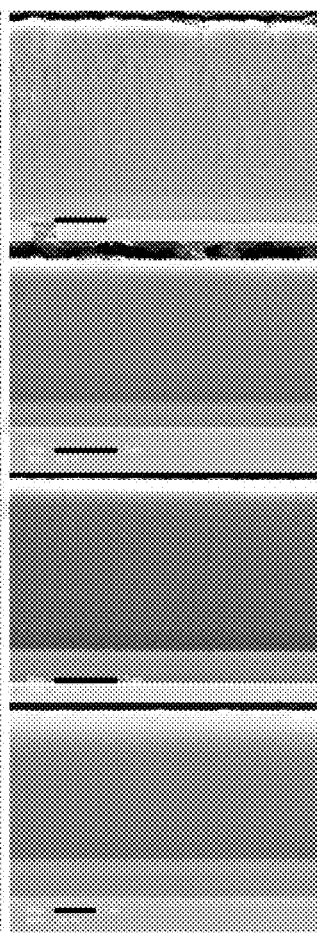
FIG. 16c includes SEM images of cross-sections of the coatings of, from top to bottom, samples 8, 11, 12 and 13, the scale set forth in the lower left hand corner is 5 µm.

FIGS. 16a, 16b, and 16c illustrate SEM images of samples 8, 11, 12 and 13, wherein sample 8 is at the top, sample 11 is at the top middle, sample 12 is at the bottom middle, and sample 13 is at the bottom of the images. FIG. 16a includes images of RC indentation on the coating surfaces, FIG. 16b includes images of the coating surfaces without indentation, and FIG. 16c includes images of cross-sectional views of the coatings. It is noted that as the amount of acetylene increases, the droplets and columnar structure decreases. In addition, the surface morphological features become smaller as acetylene flow rate increases. Finally, the coatings become more brittle as acetylene flow rate increase. Based on industry criteria, VDI 3198 (Verein Deutscher Ingenieure Normen, VDI 3198, VDI-Verlag, Dusseldorf, 1991), the coating adhesion for sample 8 was the best. Samples 11 and 12 are acceptable. However, sample 13 is unacceptable.

Figures 17A, 17B, 17C:
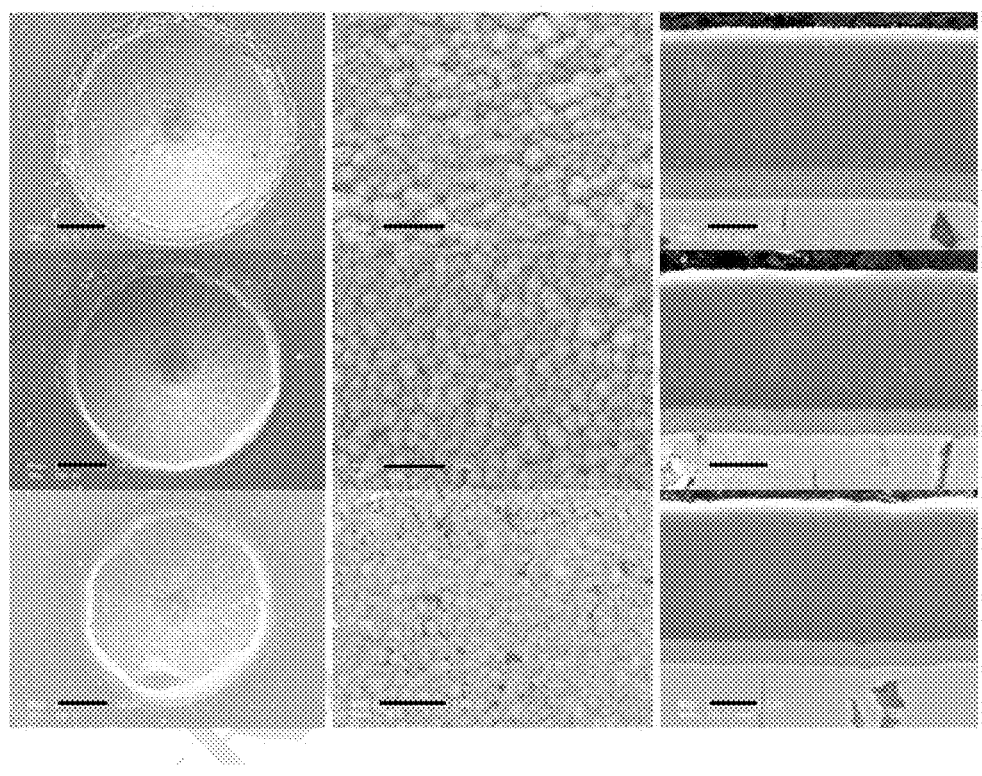
FIG. 17a includes SEM images of nanoindentations on the coatings of, from top to bottom, samples 15, 16, and 17, the scale set forth in the lower left hand corner is 200 µm.
FIG. 17b includes SEM images of the surface of the coatings of, from top to bottom, samples 15, 16, and 17, the scale set forth in the lower left hand corner is 5 µm.
FIG. 17c includes SEM images of cross-sections of the coatings of, from top to bottom, samples 15, 16, and 17, the scale set forth in the lower left hand corner is 5 µm.

FIGS. 17a, 17b and 17c illustrate SEM images of samples 15, 16 and 17, wherein sample 15 is at the top of the images, 16 is in the middle and 17 in at the bottom. FIG. 17a includes images of RC indentation on the coating surfaces. FIG. 17b includes images of the coating surfaces. FIG. 17c includes images of cross-sectional views of the coatings. The structure, morphology and indentation appear to be similar. Few droplets on the coating surfaces are observed. The columnar structure seen in samples 3, 4, and 5 is not seen and delamination is not observed, indicating that adhesion is relatively good.

Figure 18A:
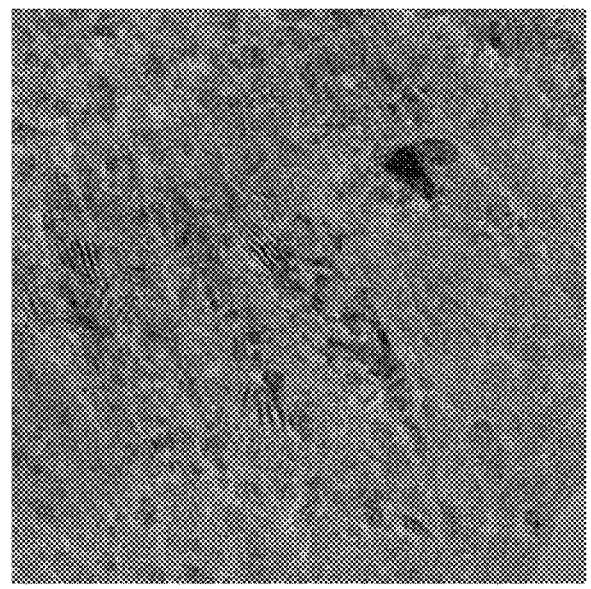
FIG. 18a is a TEM image of a cross-section of the Ti—Si—C—N coating.
Figure 18B:
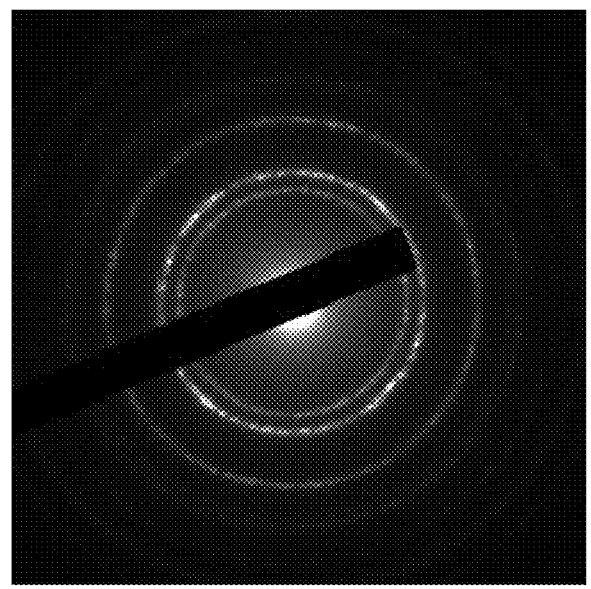
FIG. 18b is an SAED pattern of the Ti—Si—C—N nanocomposite coating.

In addition, it can be seen from FIGS. 18a and 18b that the coatings have a nanocomposite structure. The coating imaged contains nanocrystalline phases with nanocrystalline grain sizes that fall in the range of 3 to 10 nm, which may be attributed to the TiCN crystalline phases. The amorphous phase was found to be mainly composed of Si—C—N. FIG. 18b includes a selected area electron diffraction (SAED) pattern of the coating which confirms the coating has a polycrystalline face center cubic (FCC) phase which may be attributed to the TiCN.

Friction Test

Figure 19A:
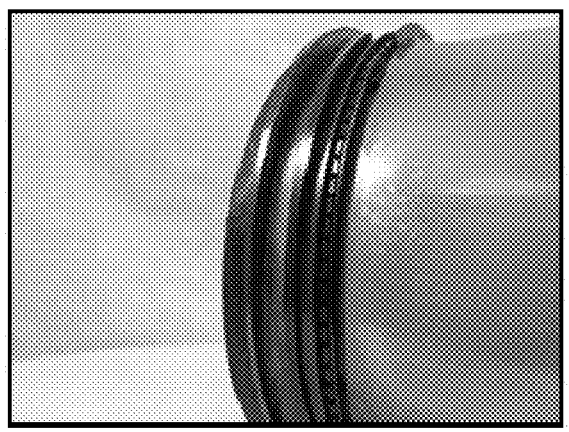
FIG. 19a is a photograph of coated rings, coated according to the conditions of samples 11 and 16.
Figure 19B:
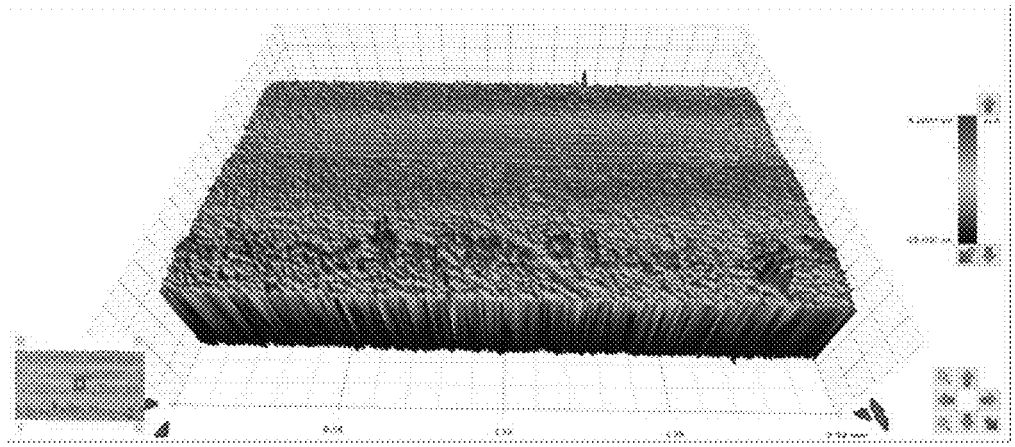
FIG. 19b illustrates a 3D graph of the topography of a section of the top ring generated with a 3D microscope after running the engine for 24 hours.
Figure 19C:
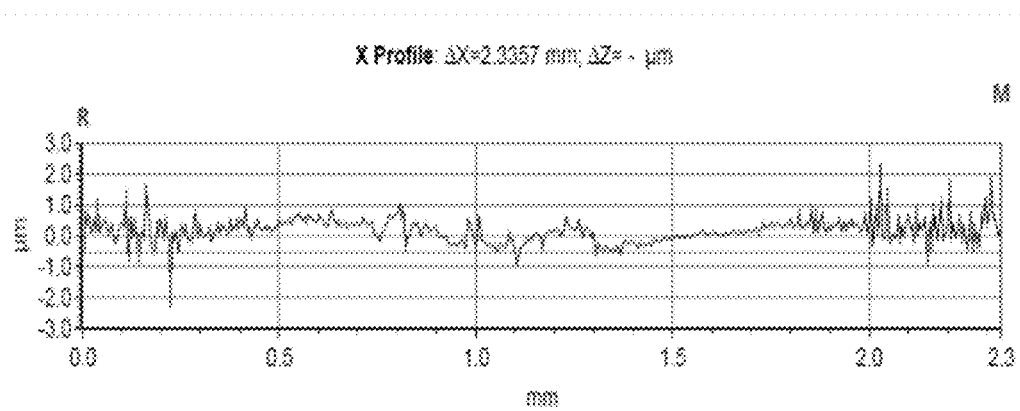
FIG. 19c is a profile of the coating taken in the x-direction generated with a 3D a microscope after running the engine for 24 hours.
Figure 19D:
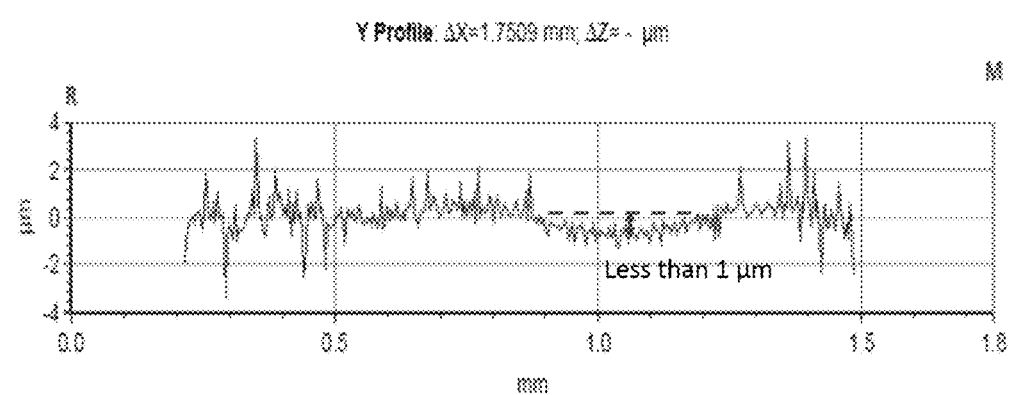
FIG. 19d is a profile taken in the y-direction generated with a 3D microscope after running the engine for 24 hours.

A set of piston rings were produced including the top, second and oil control ring, by coating rings using the depositions parameters used in Samples 11 and 16 described above. This set of rings was installed on the friction engine. The engine was run over an 8 hour period using a combination of motoring and firing at steadily increasing speeds (1500, 2000, 2500, 3000 and 2500 rpm) and loads (40, 60 and 75% engine load). The ring wear was measured using optical profilometry and the wear depth was barely measurable at less than 1 micron. FIG. 19a is a photograph of the coated rings on the piston and FIG. 19b is a 3D microscope image of the top ring. FIG. 19c is a profile taken in the x-direction using the 3D microscope and FIG. 19d is a profile taken in the y-direction using the 3D microscope after running in the engine for 24 hours.

The coefficient of friction contribution from the coated rings in the single cylinder engine was obtained using the difference between the maximum amount of work the engine can do and the actual amount of work the engine actually did. The in-cylinder pressure data is used to determine the maximum amount of work the engine can do. The actual amount of work performed is calculated form the output torque. The difference is caused by engine inefficiencies, including those due to friction loss (total friction work). The total friction loss includes the work loss due to friction in the piston, valve train, bearings, oil seals, pumps including oil, water and fuel pumps, alternator, and pumping losses. The contribution of the piston ring coefficient of friction to the total friction loss may be estimated from a comparison of the piston assembly friction with the total friction loss (which is dependent on the power output of the engine).

Figure 20:
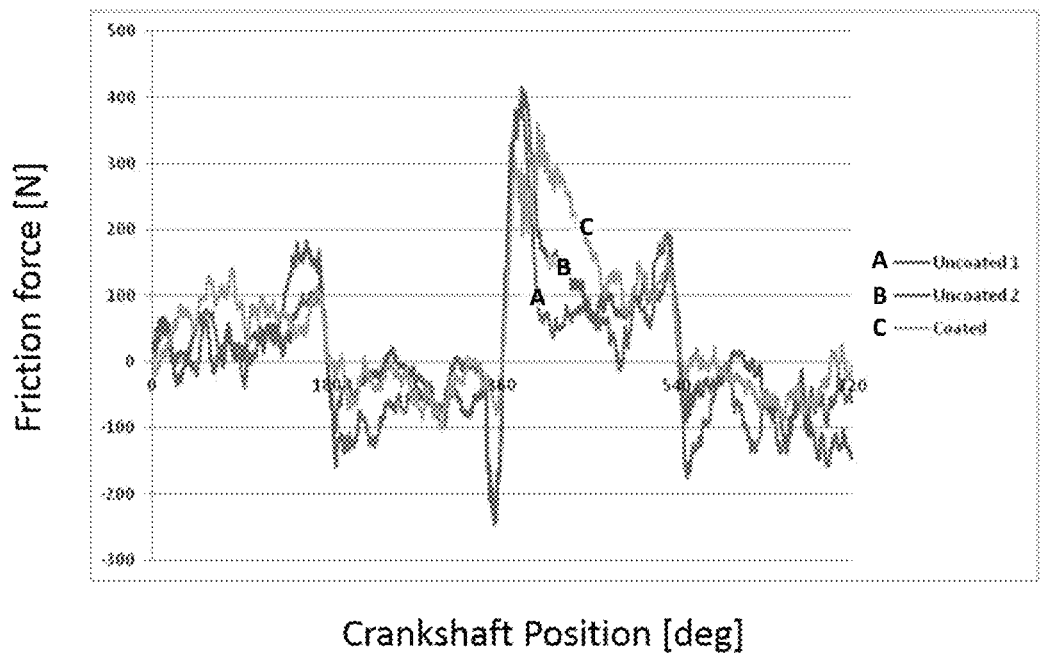
FIG. 20 is a graph of the absolute magnitude of the friction in one engine cycle for coated and uncoated piston rings.

FIG. 20 is a graph of the absolute magnitude of the friction in one engine cycle for coated and uncoated piston rings. After normalization, it can be calculated that the coated piston ring contributes to 18% of the total coefficient in the friction engine test. In contrast, the uncoated piston rings contribute to 25% to 34% of the total coefficient of friction in two different tests.

Durability Test

Figure 21A:
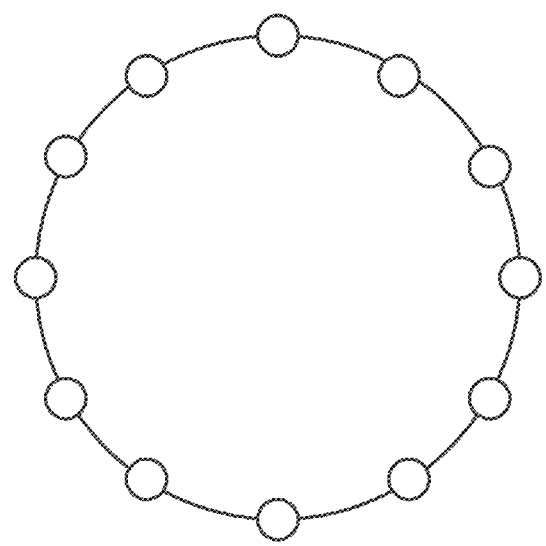
FIG. 21a is a schematic of the 12 points around a combustion cylinder liner used to take the 12 point step measurements.
Figure 21B:
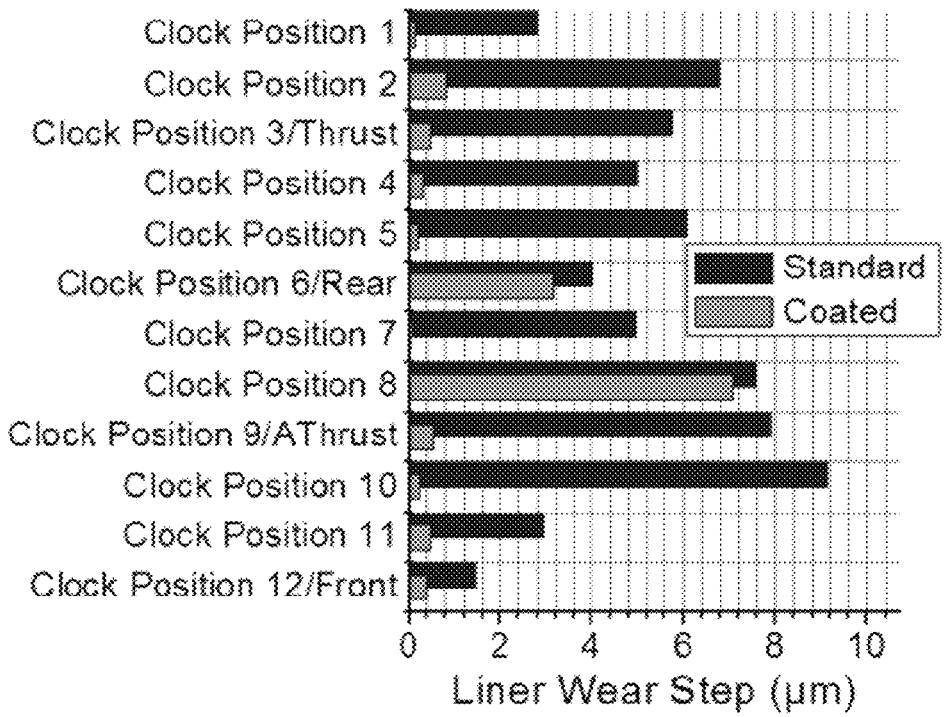
FIG. 21b is a graph of the liner wear versus the clock position around the combustion cylinder at which the wear was measured.
Figure 21C:
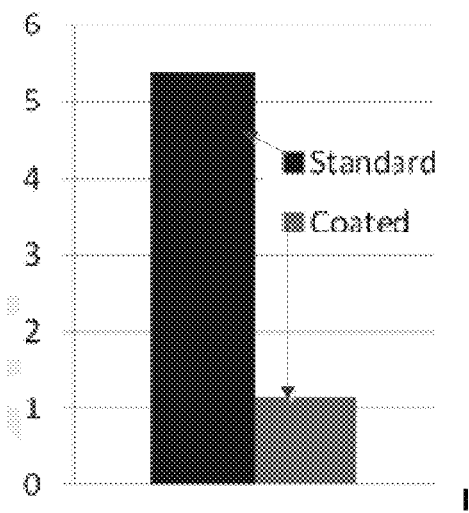
FIG. 21c illustrates the measurements of average liner wear of all 12 liner wear steps.

Based on the results of the friction engine test a coating was applied to the top and second ring of the single cylinder oil test engine using the conditions of sample 11. The test results showed lower ring weight loss for both the coated top and second ring. In addition, the mating surfaces of the cylinder liner demonstrated lower wear as indicated by a 12 point wear step measurement wherein wear is measured at 12 circumferential points around the liner of the piston seen in FIG. 21a. The results of the liner wear step measurements are shown in FIG. 21b. Although both tests showed wear steps that are on the low end of what is typically measured, the coated test still showed a 78% reduction in average liner wear, as seen in FIG. 21c.

Figure 22A:
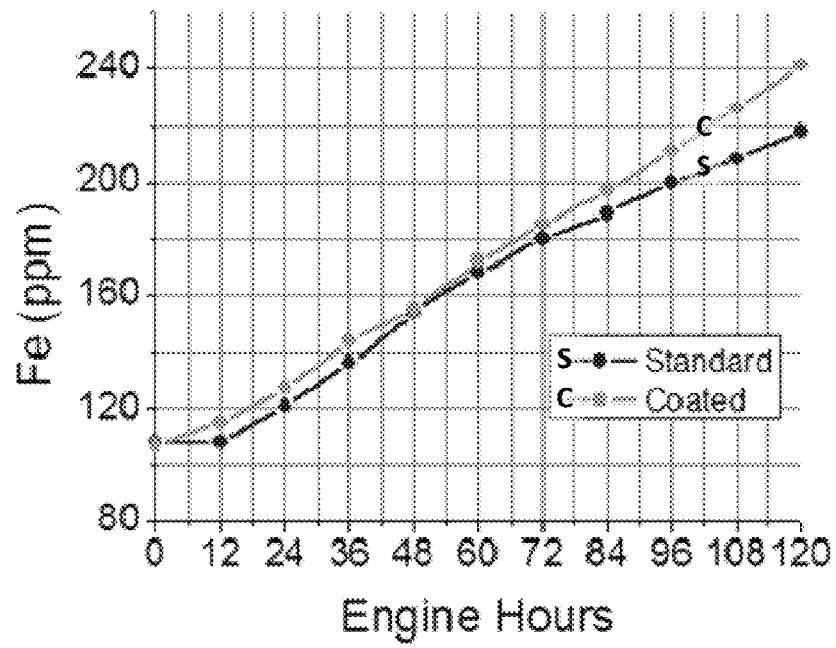
FIG. 22a illustrates the amount of iron measured by inductively coupled plasma analysis in engine oil for both coated and baseline piston rings.
Figure 22B:
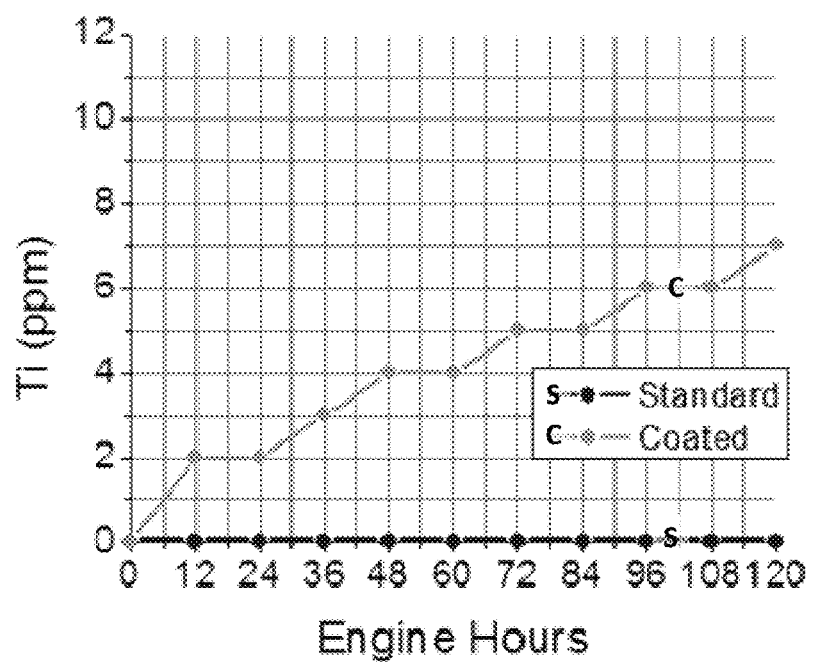
FIG. 22b illustrates the amount of titanium measured by inductively coupled plasma analysis in engine oil for both coated and baseline piston rings.

FIGS. 22a and 22b illustrate the amount of iron and titanium present in engine oil over a period of 120 hours for the cast iron baseline material and the coated ring as measured using inductively coupled plasma analysis. As seen in FIG. 22a, the test results indicate that iron concentrations for the coated and baseline materials was similar and indicates normal overall engine wear for both cases. FIG. 22b illustrates a steady accumulation of titanium in the engine oil, which suggests a steady wear rate for the coating throughout the entire test period as the only source for the titanium was the Ti—Si—C—N coating.

Deposition Rates

The coating deposition rate may be found in Table 2 reproduced above. Generally, the deposition rate is in the range of 3.3 to 6.7 micrometers per hour. Where the reactive gas flow rate of $N_2$ and HMDSN are 45 sccm and 3 g/h, respectively, and the flow rate of $C_2H_2$ in the range of 10 to 25 sccm, the deposition rate is between 4.5 and 5.8 micrometers per hour. The rate of deposition is much higher than most CrN coating rates. Consequently, the deposition of the Ti—Si—C—N coatings herein may be superior to the commercially used CrN production coatings.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of coating piston rings, comprising:
    placing a piston ring into a process chamber;
    reducing gas pressure in said process chamber;
    supplying an inert gas to said process chamber and generating a plasma of said inert gas;
    supplying nitrogen to said process chamber at a flow rate of 40 sccm to 60 sccm;
    supplying hexamethyldisilazane to said process chamber at a rate of 3 grams per hour to 9 grams per hour;
    sputtering titanium from a magnetron target in said process chamber; and
    depositing a Ti—Si—C—N coating on said piston ring, wherein said coating has a thickness in the range of 10.0 micrometers to 40.0 micrometers and exhibits a coefficient of friction of less than 0.15, a wear rate of less than $10 \times 10^{-6}$ mm$^3$/N/m, and a nanohardness in the range of 10.0 GPa to 30.0 GPa, wherein said coefficient of friction is measured using a Plint TE77 testing apparatus using 10W-30 oil maintained at 35° C. as a lubricant, under a force of 30 N, and a sliding frequency of 5 to 20 Hz, and said wear rate is measured against an alumina ball of 0.25 inches in diameter at a load of 1 N at 100 rpm in a dry environment,
    wherein said Ti—Si—C—N coating includes nanocrystalline phases having a grain size in the range of 3 nm to 10 nm in an amorphous matrix, wherein said nanocrystalline phases include $TiC_xN_y$, wherein x is in the range of 0.00 to 1.00 and y is in the range of 1.00 to 0.00.

2. The method of claim 1, wherein said nitrogen is supplied to said process chamber as nitrogen gas, ammonia, or combinations thereof.

3. The method of claim 1, further comprising supplying carbon to said process chamber, wherein said carbon is supplied as acetylene, methane, or combinations thereof.

4. The method of claim 1, further comprising negatively biasing an electron source in the range of 50 V to 120 V to form said plasma and said process chamber is biased in the range of 50 V to 150 V relative to said electron source.

5. The method of claim 1, wherein said piston ring is negatively biased in the range of 20 V to 200 V and said magnetron is negatively biased in the range of 0.05 to 10 kW.

6. The method of claim 1, wherein said deposited coating comprises titanium present in the range of 35 to 49 atomic percent, silicon present in the range of 1 to 5 atomic percent, carbon present in the range of 17 to 41 atomic percent, and nitrogen present in the range of 19 to 35 atomic percent.

7. The method of claim 1, wherein said deposited coating comprises titanium present in the range of 43.5 to 46.7 atomic percent, silicon present in the range of 1.58 to 3.04 atomic percent, carbon present in the range of 17.6 to 22.5 atomic percent, and nitrogen present in the range of 30.9 to 34.2 atomic percent.

8. The method of claim 7, wherein the coefficient of friction is in the range of 0.21 to 0.26, and the wear rate is in the range of 3.02 to 7.35×10$^{-6}$ mm$^3$/N/M.

9. The method of claim 1, further comprising supplying acetylene to said process chamber at a flow rate in the range of 10 sccm to 30 sccm and said deposited coating comprises titanium present in the range of 38 to 48.4 atomic percent, silicon present in the range of 1.84 to 2.34 atomic percent, carbon present in the range of 21.5 to 38.1 atomic percent, and nitrogen present in the range of 21.59 to 28.09 atomic percent.

10. The method of claim 9, wherein the coefficient of friction is in the range of 0.21 to 0.33, the wear rate may be in the range of 4.59×10$^{-6}$ mm$^3$/N/m to 5.02×10$^{-6}$ mm$^3$/N/m, and the nanohardness may be in the range of 14.5 GPa to 16.7 GPa.

11. The method of claim 1, further comprising supplying acetylene to said process chamber at a flow rate in the range of 15 sccm to 25 sccm and said deposited coating comprises titanium present in the range of 35.6 to 43.3 atomic percent, silicon present in the range of 2.33 to 4.12 atomic percent, carbon present in the range of 29.0 to 40.8 atomic percent, and nitrogen present in the range of 19.64 to 25.34 atomic percent.

12. The method of claim 11, wherein the coefficient of friction is in the range of 0.16 to 0.21, the wear rate is in the range of 3.84×10$^{-6}$ mm$^3$/N/m to 5.78×10$^{-6}$ mm$^3$/N/m, the nanohardness is in the range of 13.8 GPa to 14.5 GPa.

13. The method of claim 1, further comprising supplying acetylene to said process chamber wherein said deposited coating comprises titanium present in the range of 41 to 43.3 atomic percent, silicon present in the range of 2.3 to 3.8 atomic percent, carbon present in the range of 29 to 33 atomic percent, and nitrogen present in the range of 22 to 25 atomic percent.

14. The method of claim 13, wherein the coefficient of friction may be in the range of 0.21 to 0.22 and the wear rate is in the range of 4.69×10$^{-6}$ mm$^3$/N/m to 5.78×10$^{-6}$ mm$^3$/N/m.

15. The method of claim 1, wherein said amorphous matrix includes one of the following compositions: diamond like carbon, Si—N, and Si—N—C.

* * * * *